United States Patent
Lee et al.

(10) Patent No.: US 12,410,512 B2
(45) Date of Patent: *Sep. 9, 2025

(54) APPARATUS AND METHOD FOR MANUFACTURING METAL GATE STRUCTURES

(71) Applicant: Taiwan Semiconductor Manufacturing Co., Ltd., Hsinchu (TW)

(72) Inventors: Chen-Yu Lee, Hsinchu (TW); Yen-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/746,717

(22) Filed: Jun. 18, 2024

(65) Prior Publication Data

US 2024/0337012 A1  Oct. 10, 2024

Related U.S. Application Data

(63) Continuation of application No. 17/190,761, filed on Mar. 3, 2021, now Pat. No. 12,054,823.

(Continued)

(51) Int. Cl.
*C23C 16/02* (2006.01)
*C23C 14/02* (2006.01)
(Continued)

(52) U.S. Cl.
CPC ........ *C23C 16/0245* (2013.01); *C23C 14/021* (2013.01); *C23C 14/14* (2013.01);
(Continued)

(58) Field of Classification Search
CPC ......... H01L 21/76814; H01L 21/02274; H01L 29/401; H01L 21/32051; H01L 21/02334;
(Continued)

(56) References Cited

U.S. PATENT DOCUMENTS 7,416,989 B1 * 8/2008 Liu ................... H01L 21/02063
438/706
2003/0022487 A1 * 1/2003 Yoon ................. H01L 21/28518
438/642

(Continued)

FOREIGN PATENT DOCUMENTS

CN         107017157 A      8/2017
KR         20170046081 A    4/2017

(Continued)

*Primary Examiner* — Jaehwan Oh
(74) *Attorney, Agent, or Firm* — Seed IP Law Group

(57) ABSTRACT

Semiconductor processing apparatuses and methods are provided in which a pre-clean chamber receives a semiconductor wafer from a metal gate layer deposition chamber and at least partially removes an oxide layer on a metal gate layer. In some embodiments, a semiconductor processing apparatus includes a plurality of metal gate layer deposition chambers. Each of the metal gate layer deposition chambers is configured to form a metal gate layer on a semiconductor wafer. At least one pre-clean chamber of the apparatus is configured to receive the semiconductor wafer from one of the metal gate layer deposition chamber and at least partially remove an oxide layer on the metal gate layer.

20 Claims, 13 Drawing Sheets

Related U.S. Application Data

(60) Provisional application No. 63/079,797, filed on Sep. 17, 2020.

(51) Int. Cl.
*C23C 14/14* (2006.01)
*C23C 14/56* (2006.01)
*C23C 14/58* (2006.01)
*C23C 16/06* (2006.01)
*C23C 16/56* (2006.01)
*H01J 37/32* (2006.01)
*H01L 21/02* (2006.01)
*H10D 64/01* (2025.01)

(52) U.S. Cl.
CPC ........ *C23C 14/566* (2013.01); *C23C 14/5873* (2013.01); *C23C 16/06* (2013.01); *C23C 16/56* (2013.01); *H01J 37/32743* (2013.01); *H01J 37/32788* (2013.01); *H01J 37/32899* (2013.01); *H01L 21/0206* (2013.01); *H01L 21/02068* (2013.01); *H10D 64/01* (2025.01); *H01J 37/321* (2013.01); *H01J 37/32357* (2013.01); *H01J 2237/335* (2013.01)

(58) Field of Classification Search
CPC ......... H01L 21/67184; H01L 21/67207; H01L 21/67745; C23C 14/021; C23C 14/566; C23C 16/0245

See application file for complete search history.

(56) References Cited

U.S. PATENT DOCUMENTS

| | | |
|---|---|---|
| 2003/0062333 A1 | 4/2003 | Kranz et al. |
| 2003/0082307 A1 | 5/2003 | Chung et al. |
| 2004/0256351 A1* | 12/2004 | Chung .............. H01L 21/28562 257/E21.252 |
| 2005/0009325 A1* | 1/2005 | Chung .................... C23C 16/02 438/653 |
| 2011/0298062 A1* | 12/2011 | Ganguli ................. H10D 64/66 257/412 |
| 2013/0295759 A1 | 11/2013 | Lu et al. |

FOREIGN PATENT DOCUMENTS

| | | |
|---|---|---|
| KR | 20200084923 A | 7/2020 |
| TW | 201214532 A | 4/2012 |
| TW | 201403718 A | 1/2014 |
| TW | 201419439 A | 5/2014 |

\* cited by examiner

APPARATUS AND METHOD FOR MANUFACTURING METAL GATE STRUCTURES

BACKGROUND

A variety of processes are performed in the fabrication of semiconductor devices. During the fabrication of semiconductor devices, semiconductor wafers are processed in a variety of different processing tools or apparatuses. Some semiconductor processing apparatuses may be utilized to form metal gate structures on semiconductor devices, such as metal gates for transistors. The metal gate structures may include a plurality of metal gate layers, which may be successively formed in different chambers of the semiconductor processing apparatus.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
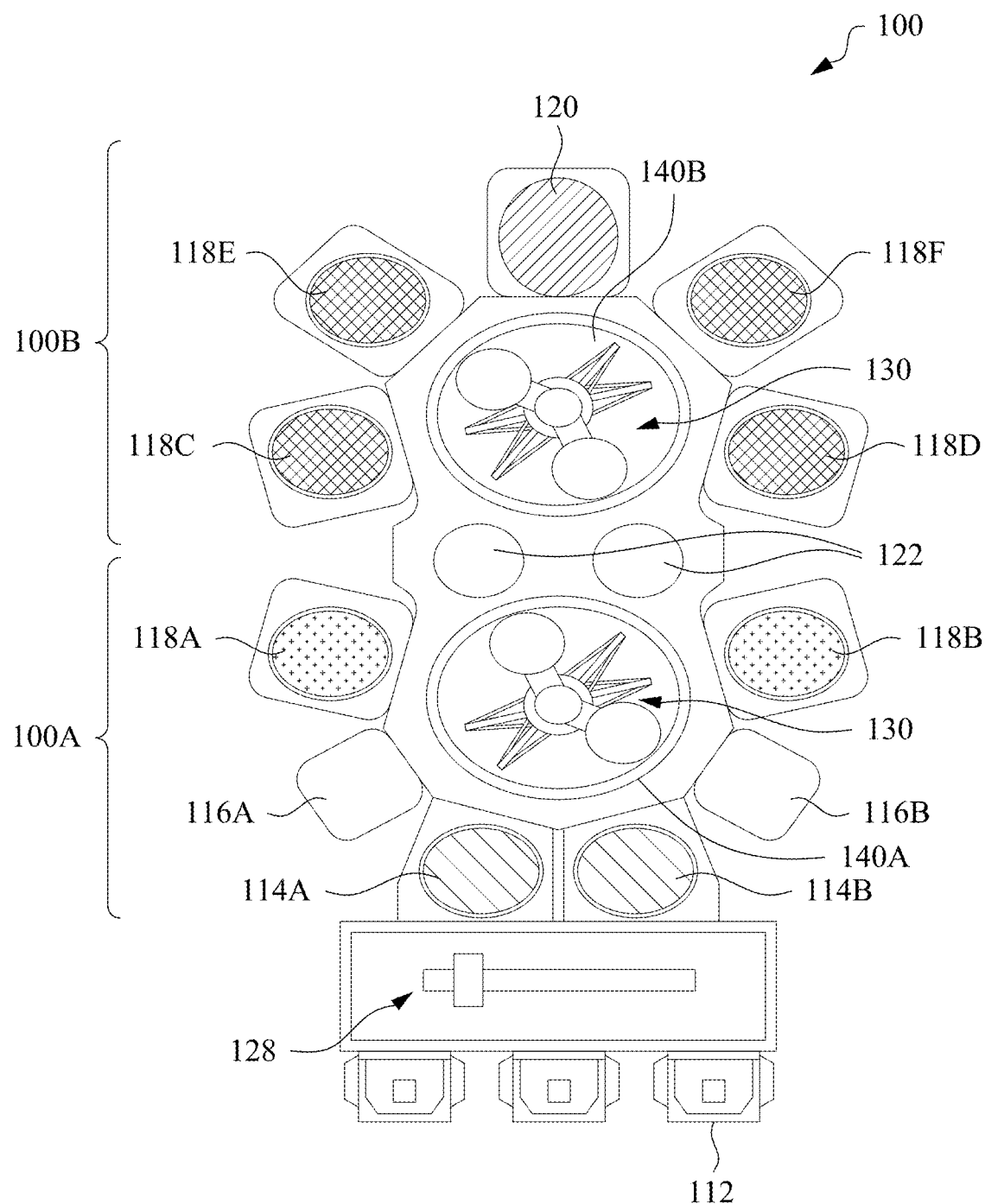
FIG. 1 is a schematic diagram illustrating a semiconductor processing apparatus, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Formation of metal gate structures in a semiconductor processing apparatus may include successively forming multiple metal gate layers in multiple different deposition processes. The deposition processes may be performed in different deposition chambers of the semiconductor processing apparatus. An oxide film or other undesired film or layer of material may form on the first metal gate layer, for example, by chemical reaction of the first metal gate layer with one or more elements or substances during processing of the semiconductor wafer after the formation of the first metal gate layer. For example, after a first metal gate layer is formed, an oxide film may begin to form on the first metal gate layer while the semiconductor wafer is transferred to another chamber of the semiconductor processing apparatus or during a hold or wait time before formation of a second metal gate layer.

The oxide layer or other undesired layer can cause undesirable effects in the final semiconductor device, and these effects are pronounced as the thickness of the metal gate layers is decreased, for example, at smaller technology nodes. Moreover, the oxide layer or other desired layer may not be uniformly formed on a metal gate layer, for example, as different hold times may result in different thicknesses of the oxide layer or other undesired layer. As such, the performance may vary from device-to-device as the metal gates may have different thicknesses and compositions. This may result in variations in various parameters, such as threshold voltage, saturation current, and on resistance of transistors including metal gates.

Embodiments provided herein include semiconductor processing apparatuses and methods that facilitate reduction or removal of an oxide or other undesirable layer on one or more of metal layers of a metal gate structure. In some embodiments, a semiconductor processing apparatus includes at least one pre-clean chamber that receives a semiconductor wafer and at least partially removes an oxide layer that is on a metal gate layer of the semiconductor wafer. The pre-clean chamber is included within the same semiconductor processing apparatus as one or more metal gate layer deposition chambers, and thus the semiconductor wafer may be transferred directly from a metal gate layer deposition chamber to the pre-clean chamber within the apparatus. That is, the oxide layer may be removed without transferring the semiconductor wafer to a separate semiconductor processing tool or apparatus.

FIG. 1 is a schematic diagram illustrating a semiconductor processing apparatus 100, in accordance with one or more embodiments of the present disclosure. The semiconductor processing apparatus 100 may be, for example, a process tool configured to form one or more metal gate features of a semiconductor device.

The semiconductor processing apparatus 100 has several processing chambers arranged in each of two clusters 100A and 100B. Each layer or feature in the various metal gate structures discussed herein can be formed inside the apparatus 100 without exposure of a workpiece (e.g., a semiconductor wafer) to an ambient or external environment.

Referring to FIG. 1, the apparatus 100 includes a plurality of load/unload ports 112, which may be referred to herein as load ports 112. The load ports 112 may be configured to receive a plurality of semiconductor wafers. For example, in some embodiments, the load ports 112 are configured to receive a wafer carrier or transport pod, such as a Front Opening Unified Pod (FOUP) that carries a plurality of wafers.

The load ports 112 may include one or more wafer handling structures. For example, each of the load ports 112 may include one or more surfaces, components, or features which supports, secures, moves, or otherwise handles a semiconductor wafer during processing of the wafer by the semiconductor processing apparatus 100. For example, the load ports 112 may include structures that are configured to receive and support or otherwise handle a semiconductor wafer from the FOUP.

The semiconductor processing apparatus 100 may include a robotic wafer handling device 128 positioned adjacent to the load ports 112 for transferring semiconductor wafers between the load ports 112 and the load locks 114A, 114B. The robotic wafer handling device 128 may be any robotic wafer handling device as known in the art of semiconductor processing. As shown in FIG. 1, the robotic wafer handling device 128 may be movable along a translational axis, for example, the robotic wafer handling device 128 may be capable of moving along an x-axis, as shown. In some embodiments, the robotic wafer handling device 128 may be capable of moving along a y-axis, or a z-axis. In some embodiments, the robotic wafer handling device 128 may be a robotic arm and may have one or more joints or pivot points about which the arm may rotate.

The load locks 114A, 114B are configured to transfer one or more wafers to or from the load ports 112, e.g., via the robotic wafer handling device 128. The load locks 114A, 114B may be or include chambers that are vented to a pressure equivalent to the load port 112 while a wafer is transferring between the load port 112 and the load locks 114A, 114B. When moving the wafer from the load lock 114A, 114B into one of the processing chambers in the apparatus 100, the load locks 114A, 114B may be vacuum pumped down to a certain degree of vacuum that is closer to the vacuum level inside the clusters 100A and 100B.

In some embodiments, a first load lock 114A may be utilized to receive wafers from one or more of the load ports 112, e.g., for processing by one or more processing chambers of the apparatus 100, and a second load lock 114B may be utilized to receive wafers after processing has been performed within the apparatus 100 and to transfer the processed wafers back to one or more of the load ports 112.

Each of the clusters 100A and 100B includes a buffer chamber 140A, 140B, each of which houses at least one wafer handling robot 130. As shown in FIG. 1, the apparatus 100 may include two buffer chambers 140A, 140B, and each of the two buffer chambers may include two wafer handling robots 130. The wafer handling robots 130 of the first buffer chamber 140A transfers the semiconductor wafers from one of the load locks 114A, 114B to one of the processing chambers, e.g., in the first cluster 100A.

In some embodiments, the first cluster 100A includes one or more degas chambers 116A, 116B. The degas chambers 116A, 116B may be utilized to remove moisture from the semiconductor wafers, e.g., from one or more layers or structures formed on the semiconductor wafers. In some embodiments, the degas chambers 116A, 116B may remove moisture or residual gas from the semiconductor wafers prior to formation of one or more metal gate features, e.g., by deposition in a processing chamber of the apparatus 100. In some embodiments, degassing processes are performed in the degas chambers 116A, 116B at a temperature of within a range of about 100 degrees C. to about 600 degrees C. In some embodiments, the degassing processes are performed in the presence of an ambient gas of Argon (Ar), Helium (He), Nitrogen ($N_2$), Hydrogen ($H_2$), Ammonia ($NH_3$), Ozone ($O_3$), carbon dioxide ($CO_2$), or Oxygen ($O_2$), and at a pressure of about 0.1 Torr to about 10 Torr, as examples. Alternatively, any other suitable processing conditions may be utilized in the degassing processes performed in the degas chambers 116A, 116B. In some embodiments, the degas chambers 116A, 116B may include a vacuum pump, and the degas chambers 116A, 116B may be in fluid communication (e.g., via the vacuum pump) with a negative pressure or vacuum in order to purge gas from the degas chambers 116A, 116B.

The semiconductor processing apparatus 100 includes a plurality of metal gate layer deposition chambers 118A-118F. In some embodiments, the first cluster 100A includes first and second metal gate layer deposition chambers 118A, 118B. The first and second metal gate layer deposition chambers 118A, 118B may be configured to form any structure or feature of a metal gate in a semiconductor device. In some embodiments, the first and second metal gate layer deposition chambers 118A, 118B are configured to deposit a first metal gate layer on one or more semiconductor devices, e.g., on a semiconductor wafer or workpiece. The first metal gate layer may be any layer or film that is formed as part of processing to form a metal gate for a semiconductor device. In various embodiments, the first metal gate layer may be a high-k dielectric layer, a barrier layer or diffusion prevention layer, a high-k capping layer, or any metal gate layer. In some embodiments, the first metal gate layer has a thickness that is less than 50 nm. In some embodiments, the first metal gate layer has a thickness that is less than 10 nm. In some embodiments, the first metal gate layer has a thickness that is less than 3 nm. In various embodiments, the first metal gate layer may have a thickness that is greater than 50 nm, and other values for the thickness of the first metal gate layer are within the scope of the disclosure.

In some embodiments, the first and second metal gate layer deposition chambers 118A, 118B may be symmetrically attached to the first cluster 100A, e.g., as a symmetrical pair that are symmetrical with one another across the first buffer chamber 140A. In some embodiments, the first and second metal gate layer deposition chambers 118A, 118B may be configured to perform a same process, e.g., to deposit a same metal gate layer on the workpiece.

One or more cooling chambers 122 may be positioned between the first and second clusters 100A, 100B, for example, between the first and second buffer chambers 140A, 140B, as shown in FIG. 1. The cooling chambers 122 may be any chambers configured to actively cool or otherwise allow the workpiece to cool down to a desired temperature at an appropriate cooling rate between processing of the workpiece by the various chambers of the apparatus 100. For example, the cooling chambers 122 may be configured to cool the workpiece between metal gate layer deposition processes without exposure to ambient or external environments.

The cooling chambers 122 may be accessed by both of the first and second buffer chambers 140A, 140B, and in some embodiments, the workpiece may be transferred from the first buffer chamber 140A to the second buffer chamber 140B via the cooling chambers 122. For example, a workpiece that has been processed in the first cluster 100A may be positioned in one of the cooling chambers 122 by the wafer handling robot 130 of the first buffer chamber 140A, and the workpiece may be picked up by the wafer handling robot 130 of the second buffer chamber 140B to begin processing in the second cluster 100B.

The second cluster 100B includes a plurality of metal gate layer deposition chambers, similar to the first cluster 100A. For example, in some embodiments, the second cluster 100B includes third, fourth, fifth, and sixth metal gate layer deposition chambers 118C-118F. The third through sixth metal gate layer deposition chambers 118C-118F may be configured to form any structure or feature of a metal gate in a semiconductor device. In some embodiments, the third through sixth metal gate layer deposition chambers 118C-118F are configured to deposit one or more different metal gate layers on the semiconductor devices of the workpiece. Each of the third through sixth metal gate layer deposition chambers 118C-118F may be configured to deposit a different metal gate layer on the workpiece, or in some embodiments, one or more of the third through sixth metal gate layer deposition chambers 118C-118F may be configured to deposit a same metal gate layer on the workpiece.

In some embodiments, the third through sixth metal gate layer deposition chambers 118C-118F may include one or more pairs of symmetrically arranged chambers, and each chamber of a respective pair may be configured to perform a same process, e.g., to deposit a same metal gate layer on the workpiece. For example, in some embodiments, the third and fourth metal gate layer deposition chambers 118C, 118D may be symmetrically attached to the second cluster 100B, e.g., as a symmetrical pair that are symmetrical with one another across the second buffer chamber 140B. In some embodiments, the third and fourth metal gate layer deposition chambers 118C, 118D may be configured to perform a same process, e.g., to deposit a same metal gate layer on the workpiece. Similarly, in some embodiments, the fifth and sixth metal gate layer deposition chambers 118E, 118F may be symmetrically attached to the second cluster 100B, and may be configured to deposit a same metal gate layer on the workpiece.

The various metal gate layers formed by the third through sixth metal gate layer deposition chambers 118C-118F may be any layer or film that is formed as part of processing to form a metal gate for a semiconductor device. In various embodiments, the metal gate layers may be a high-k dielectric layer, a barrier layer or diffusion prevention layer, a high-k capping layer, or any of a plurality of metal gate layers.

In various embodiments, the first through sixth metal gate layer deposition chambers 118A-118F may be chambers configured to perform chemical vapor deposition (CVD), physical vapor deposition (PVD), or atomic layer deposition (ALD) processes.

As shown in FIG. 1, the apparatus 100 further includes a pre-clean chamber 120. The pre-clean chamber 120 may be any chamber configured to perform a cleaning or pre-cleaning process on the workpiece before or after processing in any of the first through sixth metal gate layer deposition chambers 118A-118F. In some embodiments, the pre-clean chamber 120 is configured to at least partially remove an oxide layer that results from oxidation of one or more metal gate layers on the workpiece that are formed by any of the first through sixth metal gate layer deposition chambers 118A-118F. In some embodiments, the pre-clean chamber 120 may be a reactive plasma clean (RPC) chamber or an Aktiv™ preclean (APC) chamber.

Figure 2:
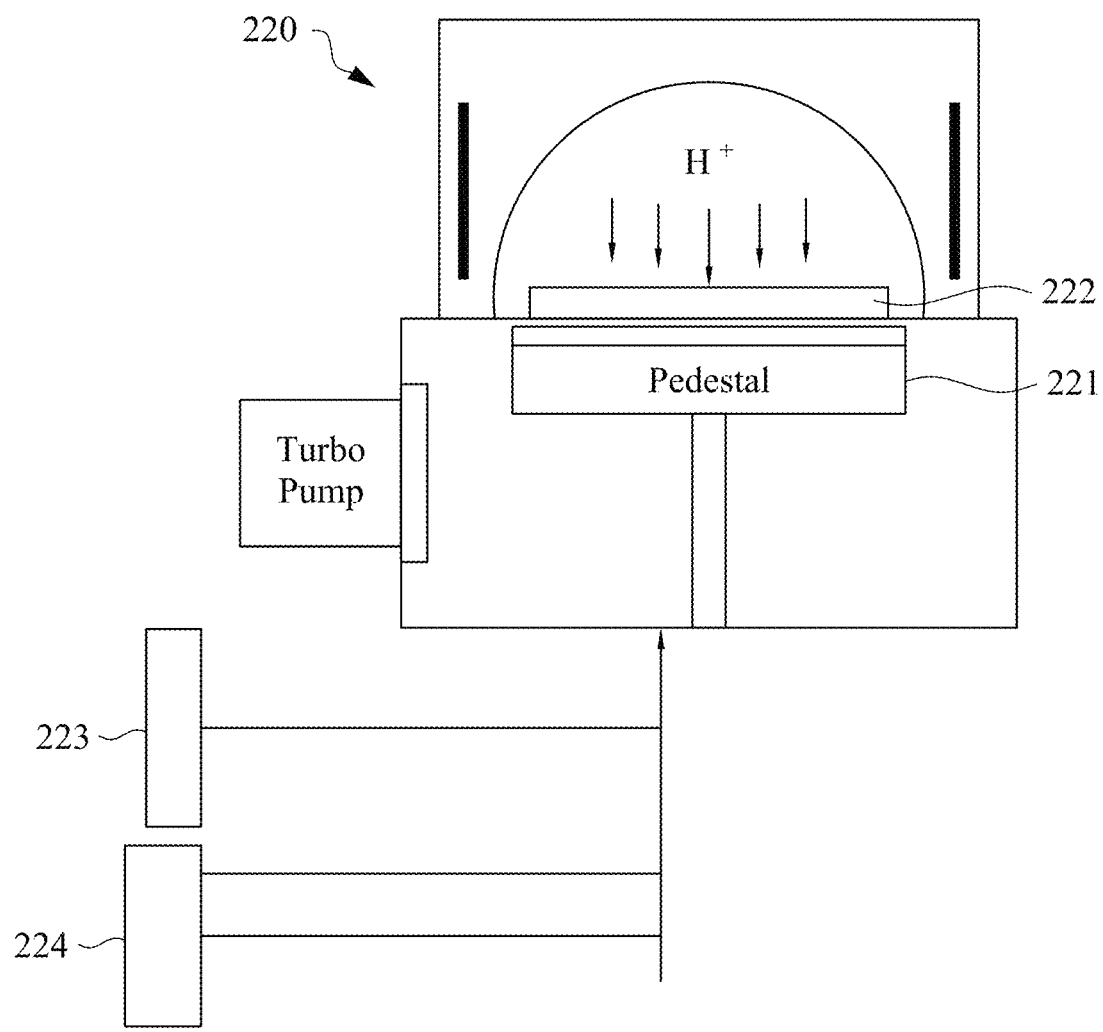
FIG. 2 is a schematic illustration showing a reactive plasma clean (RPC) chamber which may be included as a pre-clean chamber of a semiconductor processing apparatus, in some embodiments.

FIG. 2 is a schematic illustration showing a reactive plasma clean (RPC) chamber 220 which may be included as the pre-clean chamber 120 of the semiconductor processing apparatus 100 of FIG. 1, in one or more embodiments.

As shown in FIG. 2, the RPC chamber 220 includes a wafer pedestal 221 on which the semiconductor wafer 222 (or "workpiece") undergoing processing in the semiconductor processing apparatus 100 is positioned. The RPC chamber 220 receives a controlled flow of one or more gases, such as a first gas 223 and a second gas 224. In some embodiments, the first gas 223 may include a mixture of Hydrogen ($H_2$) and Helium (He). In some embodiments, the second gas 224 may include Ar. The first and second gases 223, 224 are introduced into the RPC chamber 220, where the first and second gases 223, 224 are ionized to create a plasma. In some embodiments, the plasma is an inductively coupled plasma (ICP). The wafer 222 may be exposed to the plasma, and the plasma cleans exposed surfaces of the wafer 222 within the RPC chamber 220. The RPC chamber 220 may include a variety of additional features or components as may be known within the field of semiconductor processing, such as one or more RF power supplies or generators, impedance matching circuitry, pumps, or the like.

Figure 3:
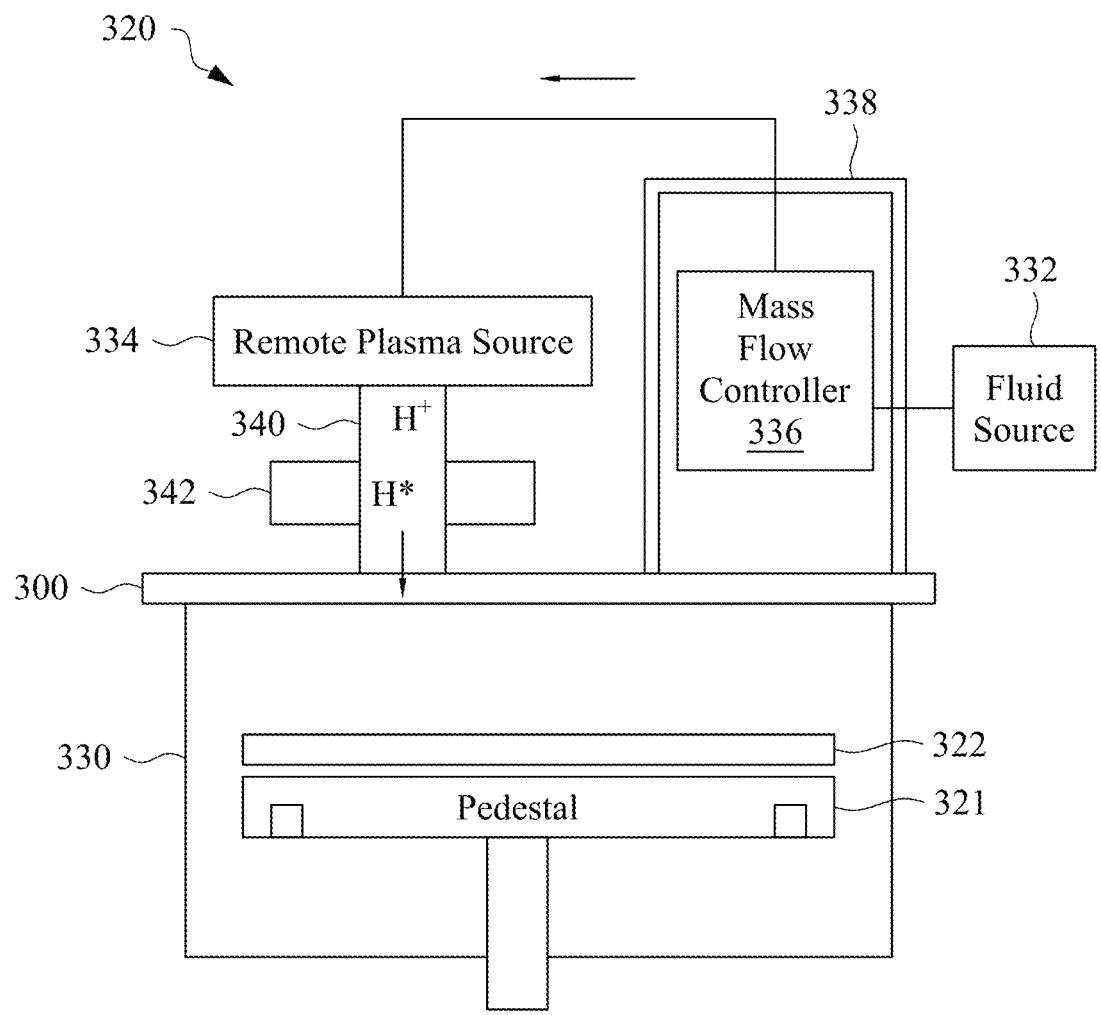
FIG. 3 is a schematic illustration showing an Aktiv™ preclean (APC) chamber which may be included as a pre-clean chamber of a semiconductor processing apparatus, in some embodiments.

FIG. 3 is a schematic illustration showing an Aktiv™ preclean (APC) chamber 320 which may be included as the pre-clean chamber 120 of the semiconductor processing apparatus 100 of FIG. 1, in one or more embodiments. The APC chamber is commercially available from Applied Materials, Inc., and provides an efficient cleaning process for removal of polymeric residues and oxides, such as may be present on one or more surfaces of a semiconductor wafer 322 or workpiece undergoing processing in the semiconductor processing apparatus 100.

As shown in FIG. 3, the APC chamber 320 includes a cleaning chamber 330 having a wafer pedestal 321 on which the semiconductor wafer 322 (or "workpiece") undergoing processing in the semiconductor processing apparatus 100 is positioned. The APC chamber 320 further includes a fluid source 332, a remote plasma source 334, a mass flow controller 336, and an electromagnetic shield 338. The cleaning chamber 330 includes a lid 300, which in some embodiments may be an aluminum lid. The fluid source 332 is configured to supply a flow of one or more fluids. For example, in various embodiments, the fluid source 332 may provide one or more of Helium (He), Argon (Ar), and Hydrogen ($H_2$); however, embodiments of the present disclosure are not limited thereto. The remote plasma source 334 is disposed on the lid 300 of the cleaning chamber 330, and is configured to generate a plasma. The mass flow controller 336 is connected in fluid communication with the fluid source 332 and the remote plasma source 334, and the mass flow controller 336 is configured to selectively allow at least one of the fluids of the fluid source 332 to flow toward the remote plasma source 334. The electromagnetic shield 338 is disposed on the lid 300 of the cleaning chamber 330, and may be used to shield the mass flow controller 336 from electromagnetic interference caused by the remote plasma source 334.

The mass flow controller 336 may be used to measure and control the flow of fluids and gases, e.g., from the fluid source 332 to the remote plasma source 334. The mass flow controller 336 is designed and calibrated to control a specific type of fluid or gas at a particular range of flow rates, as may be desired depending, for example, on a particular oxide or other material to be cleaned from the surface of the wafer 322.

In some embodiments, the plasma generated by the remote plasma source 334 is a Hydrogen ion/radical plasma. The APC chamber 320 may further include an applicator tube 340 and an ion filter 342. The applicator tube 340 of the APC chamber 320 is communicatively coupled between the remote plasma source 334 and the cleaning chamber 330. The ion filter 342 of the APC chamber 320 is disposed on the applicator tube 340 and located between the remote plasma source 334 and the cleaning chamber 330, and is used to filter ions in the applicator tube 340.

Referring again to FIG. 1, the inclusion of the pre-clean chamber 120 in the semiconductor processing apparatus 100 facilitates removal of oxides or other layers from a surface of the semiconductor wafer that is undergoing processing in the semiconductor processing apparatus 100. This may be particularly beneficial, for example, during formation of metal gate structures on semiconductor devices on the semiconductor wafer that is undergoing processing in the semiconductor processing apparatus 100.

During use of the semiconductor processing apparatus 100, a first metal gate layer may be formed (e.g., by deposition) on the semiconductor wafer during processing within one of the metal gate layer deposition chambers 118A-118F. An oxide film or other undesired film or layer of material may form on the first metal gate layer, for example, by chemical reaction of the first metal gate layer with one or more elements or substances during processing of the semiconductor wafer after the formation of the first metal gate layer. For example, after the first metal gate layer is formed, an oxide film may begin to form on the first metal gate layer while the semiconductor wafer is transferred to another chamber of the semiconductor processing apparatus 100 or during a hold or wait time before formation of a second metal gate layer.

Accordingly, in some embodiments, the semiconductor wafer may be transferred, after forming the first metal gate layer, to the pre-clean chamber 120. The oxide film may be removed, or at least partially removed, during processing in the pre-clean chamber 120. For example, in some embodiments, processing of the semiconductor wafer in the pre-clean chamber 120 may include reducing a thickness of the oxide layer by at least 50%. In some embodiments, processing of the semiconductor wafer in the pre-clean chamber 120 may include reducing a thickness of the oxide layer by at least 80%, and in some embodiments, processing of the semiconductor wafer in the pre-clean chamber 120 may include reducing a thickness of the oxide layer by at least 90%. In various embodiments, processing of the semiconductor wafer in the pre-clean chamber 120 may include reducing a thickness of the oxide layer by any value or percentage, and such values or percentages are within the scope of the disclosure. In some embodiments, processing of the semiconductor wafer in the pre-clean chamber 120 may include substantially removing an entirety of the oxide layer.

In some embodiments, after processing of the semiconductor wafer in the pre-clean chamber 120, the thickness of the oxide layer on the first metal gate layer is less than 1 nm. In some embodiments, after processing of the semiconductor wafer in the pre-clean chamber 120, the thickness of the oxide layer on the first metal gate layer is less than 0.01 nm, and in some embodiments, after processing of the semiconductor wafer in the pre-clean chamber 120, the thickness of the oxide layer on the first metal gate layer is less than 0.001 nm.

After reduction or removal of the oxide layer, the semiconductor wafer may be transferred from the pre-clean chamber 120 to any of the first through sixth metal gate layer deposition chambers 118A-118F, and a second metal gate layer may be formed on the semiconductor wafer. As the oxide layer has been reduced or removed due to processing in the pre-clean chamber 120, the second metal gate layer may be formed directly on the first metal gate layer, or the second metal gate layer may be formed on the first metal gate layer with only a very thin layer of oxide between the first and second metal gate layers due to the removal of a substantial portion of the thickness of the oxide layer. Accordingly, as the oxide layer between the first and second metal gate layers has been reduced or removed, the properties and performance of a metal gate (e.g., including the first and second metal gate layers) formed on the semiconductor wafer may be improved as only a relatively insignificant thickness of an oxide layer (if any) remains between the first and second metal gate layers.

Moreover, due to reduction or removal of the oxide layer, the thickness and composition of the metal gates formed on various devices may be substantially the same even on different semiconductor wafers which may be processed by the semiconductor processing apparatus 100, even where the various different wafers may have different wait times or processing times between or within the chambers of the apparatus 100. For example, the thickness and composition of the metal gates may be substantially the same even if one of the semiconductor wafers is held for a longer period of time after formation of the first metal gate layer and prior to formation of the second metal gate layer, in which case an oxide or other undesirable film may form having a greater thickness than would otherwise form on a different semiconductor wafer with a lesser wait time prior to formation of the second metal gate layer. Nonetheless, as the semiconductor wafers are processed in the pre-clean chamber 120 prior to forming the second metal gate layer, the oxide layer or other undesirable film will be removed or reduced to a substantially same thickness, thereby facilitating a substantially uniform thickness and composition of the metal gate (e.g., after forming the second metal gate layer and any subsequent metal gate layers, as may be desired depending on design). This also results in substantially uniform device performance from device-to-device as the metal gates are substantially uniform, such as, for example, substantially uniform threshold voltage, saturation current, and on resistance of transistors including metal gates.

The second metal gate layer may be any layer or film that is formed as part of processing to form a metal gate for a semiconductor device. In various embodiments, the second metal gate layer may be a high-k dielectric layer, a barrier layer or diffusion prevention layer, a high-k capping layer, or any metal gate layer. In some embodiments, the second metal gate layer has a thickness that is less than 50 nm. In some embodiments, the second metal gate layer has a thickness that is less than 10 nm. In some embodiments, the second metal gate layer has a thickness that is less than 3 nm. In various embodiments, the second metal gate layer may have a thickness that is greater than 50 nm, and other values for the thickness of the second metal gate layer are within the scope of the disclosure.

Figure 4:
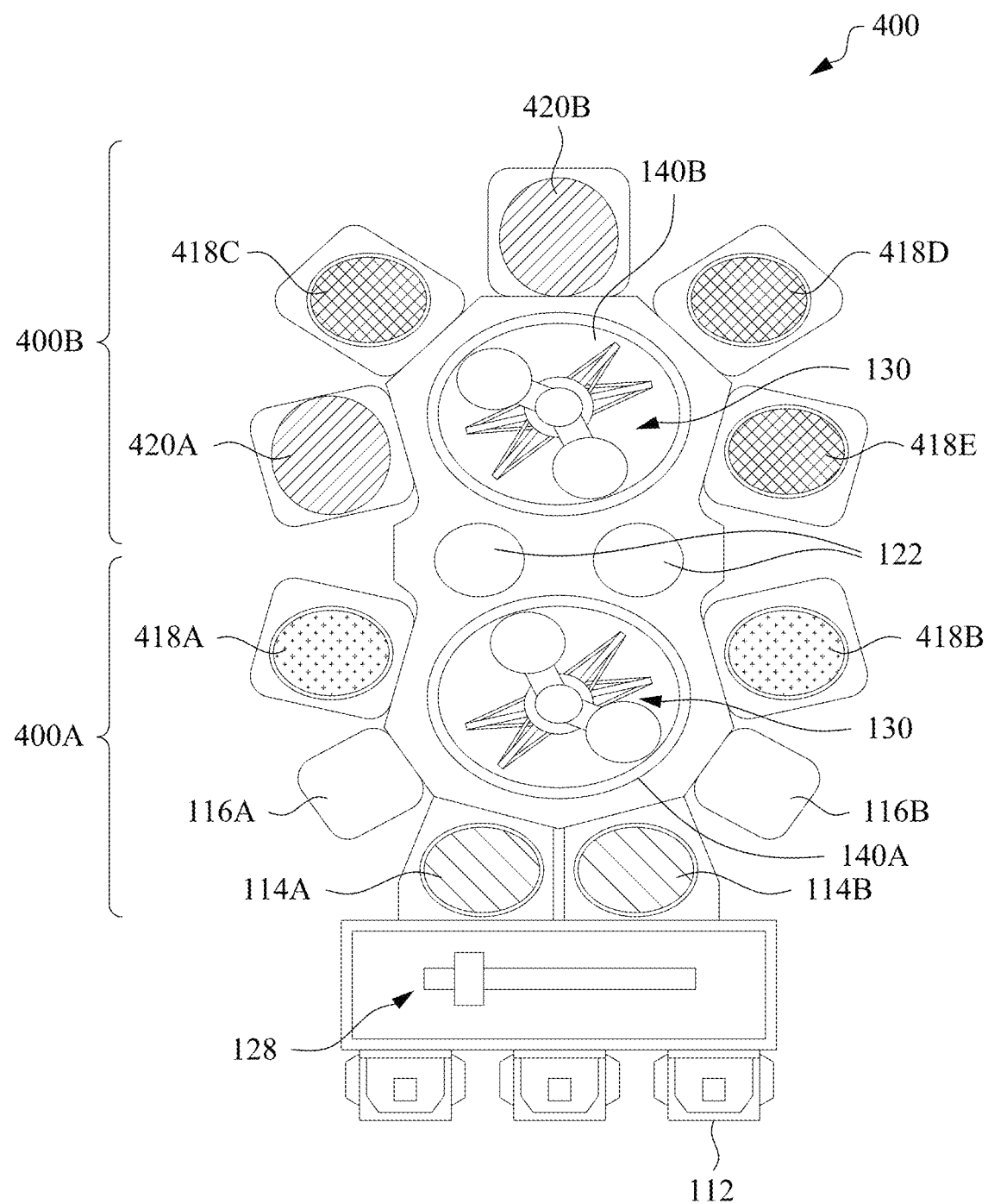
FIG. 4 is a schematic diagram illustrating a semiconductor processing apparatus, in accordance with some embodiments.

FIG. 4 is a schematic diagram illustrating a semiconductor processing apparatus 400, in accordance with one or more embodiments of the present disclosure. The semiconductor processing apparatus 400 may be, for example, a process tool configured to form one or more metal gate features of a semiconductor device. Many of the features of the semiconductor processing apparatus 400 shown in FIG. 4 may be the same or substantially similar to features of the semiconductor processing apparatus 100 previously described herein with respect to FIG. 1, and description of such same or substantially similar features will not be repeated in the following description of the semiconductor processing apparatus 400. Rather, the description of the semiconductor processing apparatus 400 will focus primarily on the differences with respect to the semiconductor processing apparatus 100 of FIG. 1.

As shown in FIG. 4, the semiconductor processing apparatus 400 includes a plurality of load ports 112, a robotic wafer handling device 128, load locks 114A, 114B, degas chambers 116A, 116B, buffer chambers 140A, 140B, wafer handling robots 130, and cooling chambers 122, each of which may be the same or substantially the same as previously described with respect to the semiconductor processing apparatus 100 of FIG. 1.

Moreover, the semiconductor processing apparatus 400 includes a plurality of metal gate layer deposition chambers 418A-418E, each of which may be the same or substantially the same as the metal gate layer deposition chambers 118A-118F previously described with respect to FIG. 1. For example, each of the metal gate layer deposition chambers 418A-418E may be configured to form any structure or feature of a metal gate in a semiconductor device. In some embodiments, the metal gate layer deposition chambers 418A-418E may be configured to deposit a metal gate layer (e.g., a first or second metal gate layer, or any other metal gate layer) on one or more semiconductor devices, e.g., on a semiconductor wafer or workpiece. The metal gate layer may be any layer or film that is formed as part of processing to form a metal gate for a semiconductor device. In various embodiments, the metal gate layer may be a high-k dielectric layer, a barrier layer or diffusion prevention layer, a high-k capping layer, or any metal gate layer. In various embodiments, the metal gate layer deposition chambers 418A-418E may be chambers configured to perform chemical vapor deposition (CVD), physical vapor deposition (PVD), or atomic layer deposition (ALD) processes.

Similar to the semiconductor processing apparatus 100 shown in FIG. 1, the various chambers of the semiconductor processing apparatus 400 shown in FIG. 4 may be arranged in each of two clusters 400A and 400B. The clusters 400A and 400B may be the same or substantially the same as the clusters 100A and 100B as previously described with respect to FIG. 1, except for the differences described herein.

As can be seen from FIG. 4, the semiconductor processing apparatus 400 includes two pre-clean chambers 420A, 420B, which may be arranged, for example, as part of the second cluster 400B. Each of the pre-clean chambers 420A, 420B may be the same or substantially the same as the pre-clean chamber 120 previously described with respect to FIG. 1. For example, the pre-clean chambers 420A, 420B may be any chamber configured to perform a cleaning or pre-cleaning process on the semiconductor wafer before or after processing in any of the metal gate layer deposition chambers 418A-418E. In some embodiments, the pre-clean chambers 420A, 420B may be a reactive plasma clean (RPC) chamber or an Aktiv™ preclean (APC) chamber, as previously described with respect to FIGS. 2 and 3.

The inclusion of the pre-clean chambers 420A, 420B in the semiconductor processing apparatus 400 facilitates removal of oxides or other layers from a surface of the semiconductor wafer that is undergoing processing in the semiconductor processing apparatus 400. By having two pre-clean chambers, the semiconductor processing apparatus 400 may perform pre-cleaning (e.g., removal of oxide or other layers) on semiconductor wafers in each of the pre-clean chambers 420A, 420B at the same time.

This increases the throughput of processing within the semiconductor processing apparatus 400 in some embodiments.

Moreover, the inclusion of two pre-clean chambers facilitates, for example, the following processing sequence: formation of a first metal gate layer (e.g., by one of the first or second metal gate layer deposition chambers 418A, 418B), then removal of an oxide layer on the first metal gate layer by processing in the first pre-clean chamber (420A), then formation of a second metal gate layer (e.g., by the third metal gate layer deposition chamber 418C), then removal of an oxide layer on the second metal gate layer by processing in the second pre-clean chamber (420B), then formation of a third metal gate layer (e.g., by the fourth or fifth metal gate layer deposition chambers 418D, 418E). Such a processing sequence may be advantageous depending on the structure or a number of metal gate layers to be included as part of a metal gate. However, embodiments of the present disclosure are not limited to such a processing sequence. For example, in various embodiments, a semiconductor wafer may be processed by only one of the pre-clean chambers 420A, 420B during processing in the apparatus 400.

Figure 5:
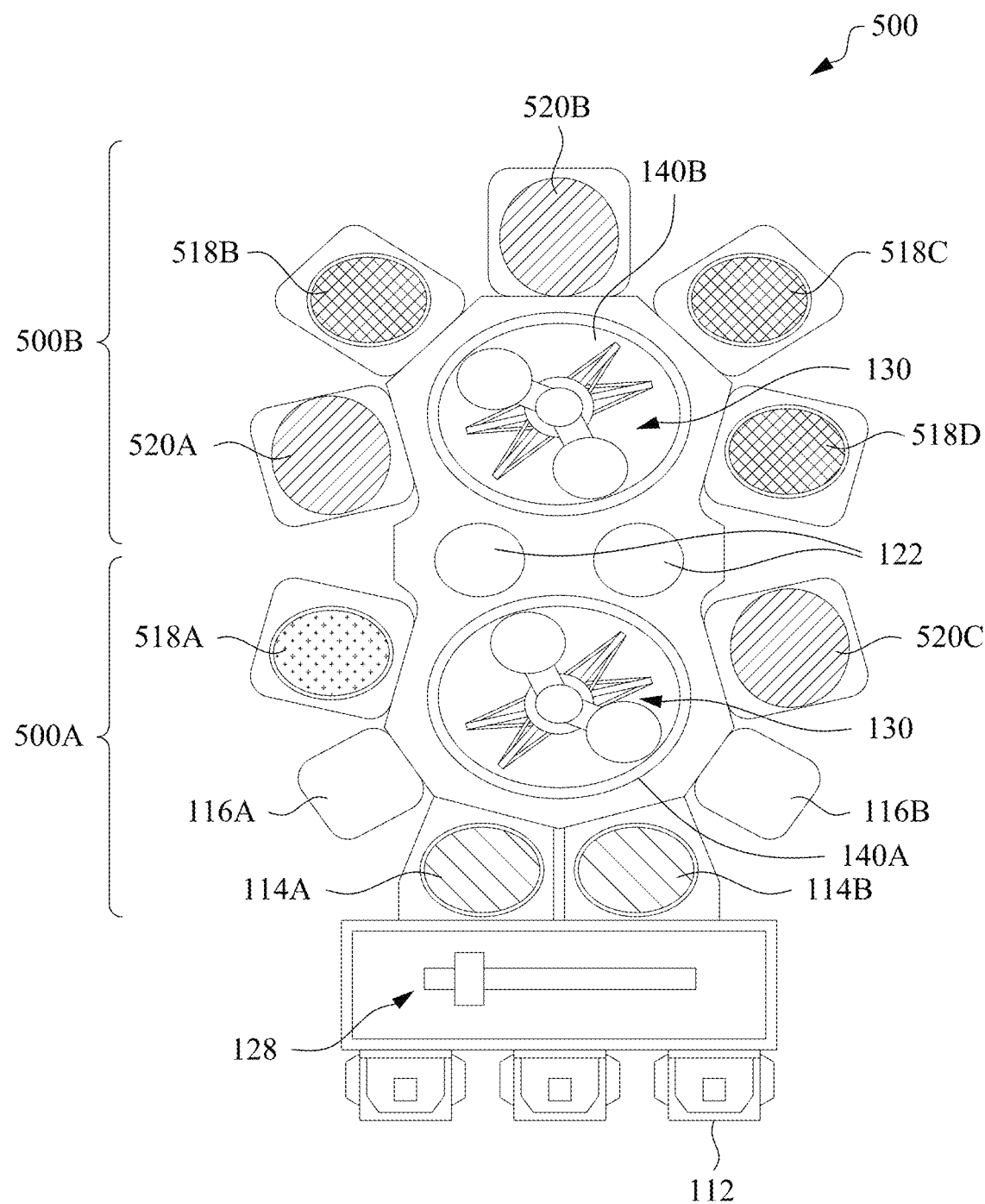
FIG. 5 is a schematic diagram illustrating a semiconductor processing apparatus, in accordance with some embodiments.

FIG. 5 is a schematic diagram illustrating a semiconductor processing apparatus 500, in accordance with one or more embodiments of the present disclosure. The semiconductor processing apparatus 500 may be, for example, a process tool configured to form one or more metal gate features of a semiconductor device. Many of the features of the semiconductor processing apparatus 500 shown in FIG. 5 may be the same or substantially similar to features of the semiconductor processing apparatus 100 previously described herein with respect to FIG. 1, and description of such same or substantially similar features will not be repeated in the following description of the semiconductor processing apparatus 500. Rather, the description of the semiconductor processing apparatus 500 will focus primarily on the differences with respect to the semiconductor processing apparatus 100 of FIG. 1.

As shown in FIG. 5, the semiconductor processing apparatus 500 includes a plurality of load ports 112, a robotic wafer handling device 128, load locks 114A, 114B, degas chambers 116A, 116B, buffer chambers 140A, 140B, wafer handling robots 130, and cooling chambers 122, each of which may be the same or substantially the same as previously described with respect to the semiconductor processing apparatus 100 of FIG. 1.

The semiconductor processing apparatus 500 further includes a plurality of metal gate layer deposition chambers 518A-518D, each of which may be the same or substantially the same as the metal gate layer deposition chambers 118A-118F previously described with respect to FIG. 1.

The various chambers of the semiconductor processing apparatus 500 shown in FIG. 5 may be arranged in each of two clusters 500A and 500B. The clusters 500A and 500B may be the same or substantially the same as the clusters 100A and 100B as previously described with respect to FIG. 1, except for the differences described herein.

As can be seen from FIG. 5, the semiconductor processing apparatus 500 includes three pre-clean chambers 520A-520C. First and second pre-clean chambers 520A, 520B may be arranged, for example, as part of the second cluster 500B, while a third pre-clean chamber 520C may be arranged as part of the first cluster 500A. Each of the pre-clean chambers 520A-520C may be the same or substantially the same as the pre-clean chamber 120 previously described with respect to FIG. 1. For example, the pre-clean chambers 520A-520C may be any chamber configured to perform a cleaning or pre-cleaning process on the semiconductor wafer before or after processing in any of the metal gate layer deposition chambers 518A-518D. In some embodiments, the pre-clean chambers 520A-520C may be a reactive plasma clean (RPC) chamber or an Aktiv™ preclean (APC) chamber, as previously described with respect to FIGS. 2 and 3.

The inclusion of the pre-clean chambers 520A-520C in the semiconductor processing apparatus 500 facilitates removal of oxides or other layers from a surface of the semiconductor wafer that is undergoing processing in the semiconductor processing apparatus 500, e.g., after formation of a metal gate layer. By having three pre-clean chambers, the semiconductor processing apparatus 500 may perform pre-cleaning (e.g., removal of oxide or other layers) on semiconductor wafers in each of the pre-clean chambers 520A-520C at the same time. This increases the throughput of processing within the semiconductor processing apparatus 500 in some embodiments.

Moreover, the inclusion of three pre-clean chambers facilitates, for example, the following processing sequence: formation of a first metal gate layer (e.g., by the first metal gate layer deposition chamber 518A in the first cluster 500A), then removal of an oxide layer on the first metal gate layer by processing in the first pre-clean chamber (520A), then formation of a second metal gate layer (e.g., by the second metal gate layer deposition chamber 518B in the second cluster 500B), then removal of an oxide layer on the second metal gate layer by processing in the second pre-clean chamber (520B), then formation of a third metal gate layer (e.g., by the third or fourth metal gate layer deposition chambers 518C, 518D), and then removal of an oxide layer on the third metal gate layer by the third pre-clean chamber (520C). Such a processing sequence may be advantageous depending on the structure or a number of metal gate layers to be included as part of a metal gate. However, embodiments of the present disclosure are not limited to such a processing sequence. For example, in various embodiments, a semiconductor wafer may be processed by less than three of the pre-clean chambers 520A-520C during processing in the apparatus 500.

In some embodiments, the third pre-clean chamber 520C may be used to remove any oxide or other undesired layer from a final metal gate layer that is formed on the semiconductor wafer, and the wafer may then be returned, for example, to one of the load ports 112.

Figure 6:
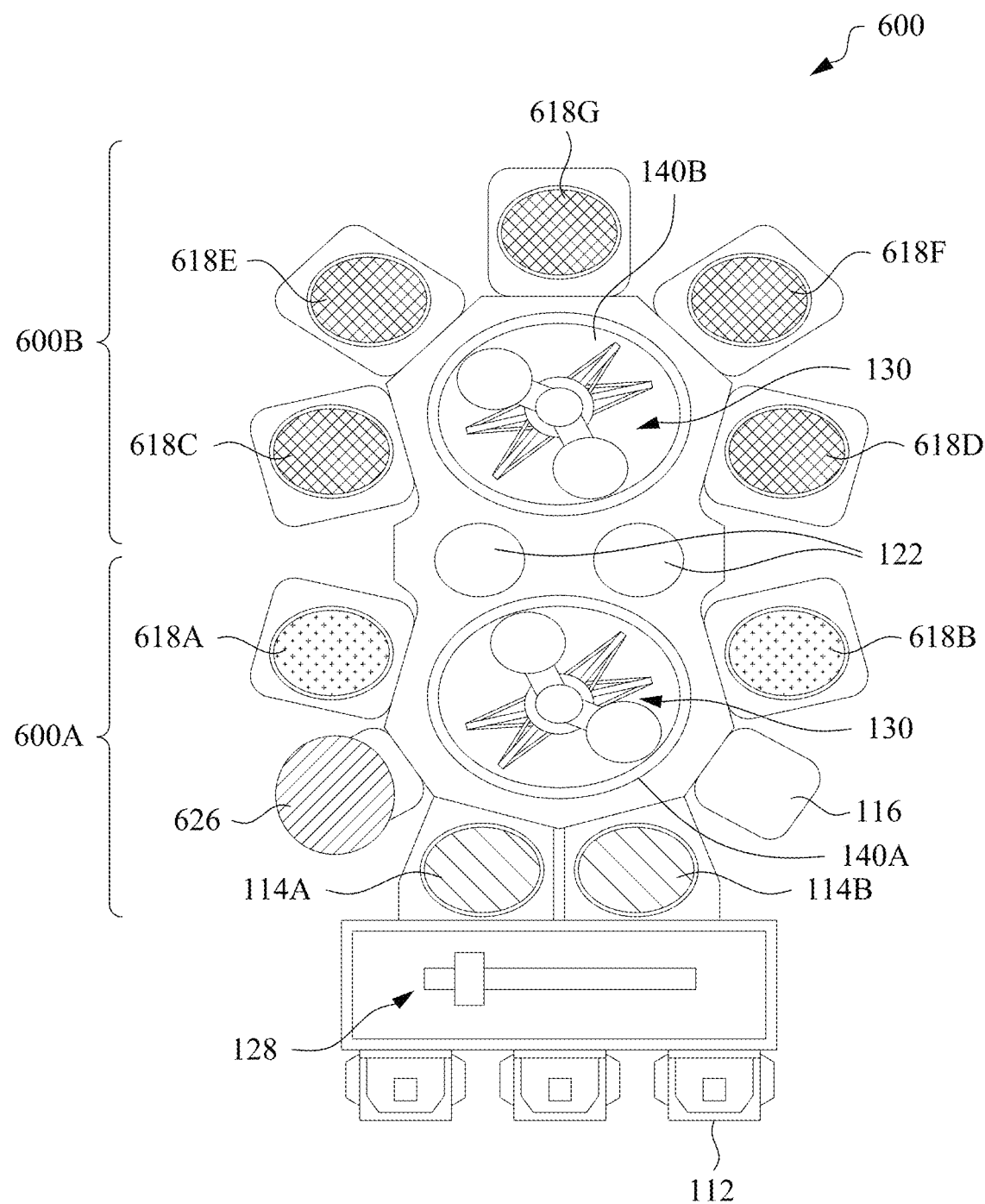
FIG. 6 is a schematic diagram illustrating a semiconductor processing apparatus, in accordance with some embodiments.

FIG. 6 is a schematic diagram illustrating a semiconductor processing apparatus 600, in accordance with one or more embodiments of the present disclosure. The semiconductor processing apparatus 600 may be, for example, a process tool configured to form one or more metal gate features of a semiconductor device. Many of the features of the semiconductor processing apparatus 600 shown in FIG. 6 may be the same or substantially similar to features of the semiconductor processing apparatus 100 previously described herein with respect to FIG. 1, and description of such same or substantially similar features will not be repeated in the following description of the semiconductor processing apparatus 600. Rather, the description of the semiconductor processing apparatus 600 will focus primarily on the differences with respect to the semiconductor processing apparatus 100 of FIG. 1.

As shown in FIG. 6, the semiconductor processing apparatus 600 includes a plurality of load ports 112, a robotic wafer handling device 128, load locks 114A, 114B, a degas chambers 116, buffer chambers 140A, 140B, wafer handling robots 130, and cooling chambers 122, each of which may be the same or substantially the same as previously described with respect to the semiconductor processing apparatus 100 of FIG. 1.

The semiconductor processing apparatus 600 further includes a plurality of metal gate layer deposition chambers 618A-618G, each of which may be the same or substantially the same as the metal gate layer deposition chambers 118A-118F previously described with respect to FIG. 1. However, the apparatus 600 may include a greater number of metal gate layer deposition chambers than in the apparatus 100 of FIG. 1, for example, as shown in FIG. 6, the semiconductor processing apparatus 600 may include a total of seven metal gate layer deposition chambers.

The various chambers of the semiconductor processing apparatus 600 shown in FIG. 6 may be arranged in each of two clusters 600A and 600B. The clusters 600A and 600B may be the same or substantially the same as the clusters 100A and 100B as previously described with respect to FIG. 1, except for the differences described herein.

As can be seen from FIG. 6, the semiconductor processing apparatus 600 includes a pre-clean and degas chamber 626, which may be arranged, for example, as part of the first cluster 600A. The pre-clean and degas chamber 626 may include, in a same chamber, the features and functionalities of the degas chambers 116A, 116B and the pre-clean chamber 120 previously described with respect to FIG. 1. That is, the pre-clean and degas chamber 626 may be a combined chamber that includes degassing and pre-cleaning functionalities. For example, the pre-clean and degas chamber 626 may include substantially the same features as the pre-clean chamber 120 previously described with respect to FIG. 1, and the pre-clean and degas chamber 626 may be any chamber configured to perform a cleaning or pre-cleaning process on the semiconductor wafer before or after processing in any of the metal gate layer deposition chambers 618A-618G.

In some embodiments, the pre-clean and degas chamber 626 may be a reactive plasma clean (RPC) chamber or an Aktiv™ preclean (APC) chamber, as previously described with respect to FIGS. 2 and 3.

The pre-clean and degas chamber 626 may further include substantially the same features as the degas chambers 116A, 116B previously described with respect to FIG. 1, and may be utilized to remove moisture from the semiconductor wafers, e.g., from one or more layers or structures formed on the semiconductor wafers. In some embodiments, the pre-clean and degas chamber 626 includes one or more gas supply lines or vacuum pump lines which facilitates performance of degassing processes in the presence of an ambient gas of Argon (Ar), Helium (He), Nitrogen ($N_2$), Hydrogen ($H_2$), Ammonia ($NH_3$), Ozone ($O_3$), carbon dioxide ($CO_2$), or Oxygen ($O_2$), and at a pressure of about 0.1 Torr to about 10 Torr, as examples. In some embodiments, the pre-clean and degas chamber 626 may include a vacuum pump which may generate a negative pressure or vacuum within the pre-clean and degas chamber 626 in order to purge gas from the pre-clean and degas chamber 626. In some embodiments, degassing processes are performed in the pre-clean and degas chamber 626 at a temperature of within a range of about 100 degrees C. to about 600 degrees C. Alternatively, any other suitable processing conditions may be utilized in the degassing processes performed in the pre-clean and degas chamber 626.

The inclusion of the pre-clean and degas chamber 626 in the semiconductor processing apparatus 600 facilitates removal of oxides or other layers from a surface of the semiconductor wafer that is undergoing processing in the semiconductor processing apparatus 600, e.g., after formation of a metal gate layer. Further, by including the capability of performing both pre-clean and degassing processes in the pre-clean and degas chamber 626, it is possible to include additional chambers (e.g., additional metal gate layer deposition chambers) in the apparatus 600 within a same space, e.g., within a limited space of the apparatus 600.

Moreover, the inclusion of the pre-clean and degas chamber 626 facilitates, for example, the following processing sequence: degassing the semiconductor wafer in the pre-clean and degas chamber 626 or the degas chamber 116, then formation of a first metal gate layer (e.g., by any of the metal gate layer deposition chambers 618A-618G), then removal of an oxide layer on the first metal gate layer by performing a pre-clean process in the pre-clean and degas chamber 626, then formation of a second metal gate layer (e.g., by any of the metal gate layer deposition chambers 618A-618G), then removal of an oxide layer on the second metal gate layer by performing a pre-clean process in the pre-clean and degas chamber 626. This sequence may be repeated any number of times in order to form additional metal gate layers as may be desired. Such a processing sequence may be advantageous depending on the structure or a number of metal gate layers to be included as part of a metal gate. However, embodiments of the present disclosure are not limited to such a processing sequence.

Figure 7:
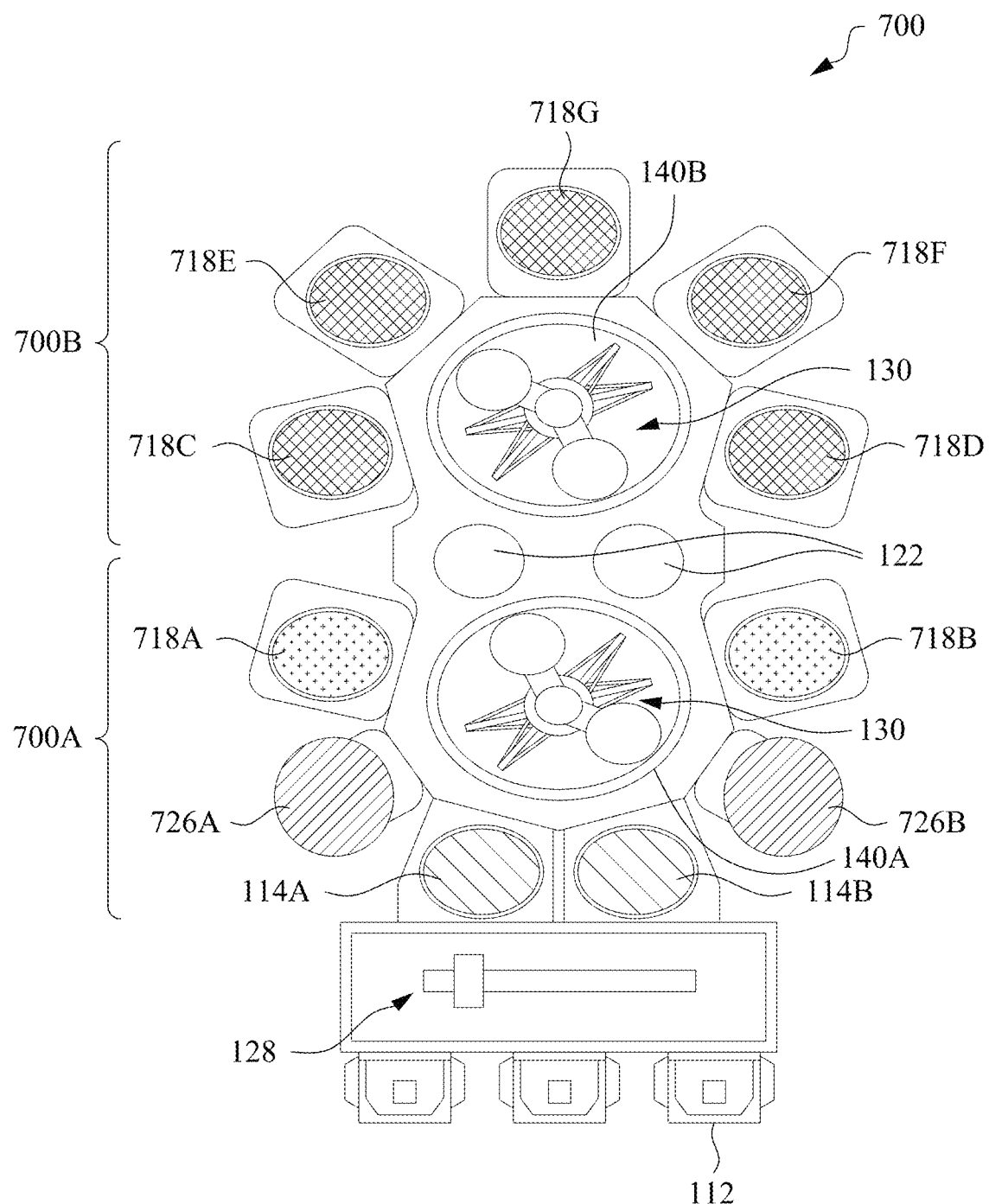
FIG. 7 is a schematic diagram illustrating a semiconductor processing apparatus, in accordance with some embodiments.
Figure 8:
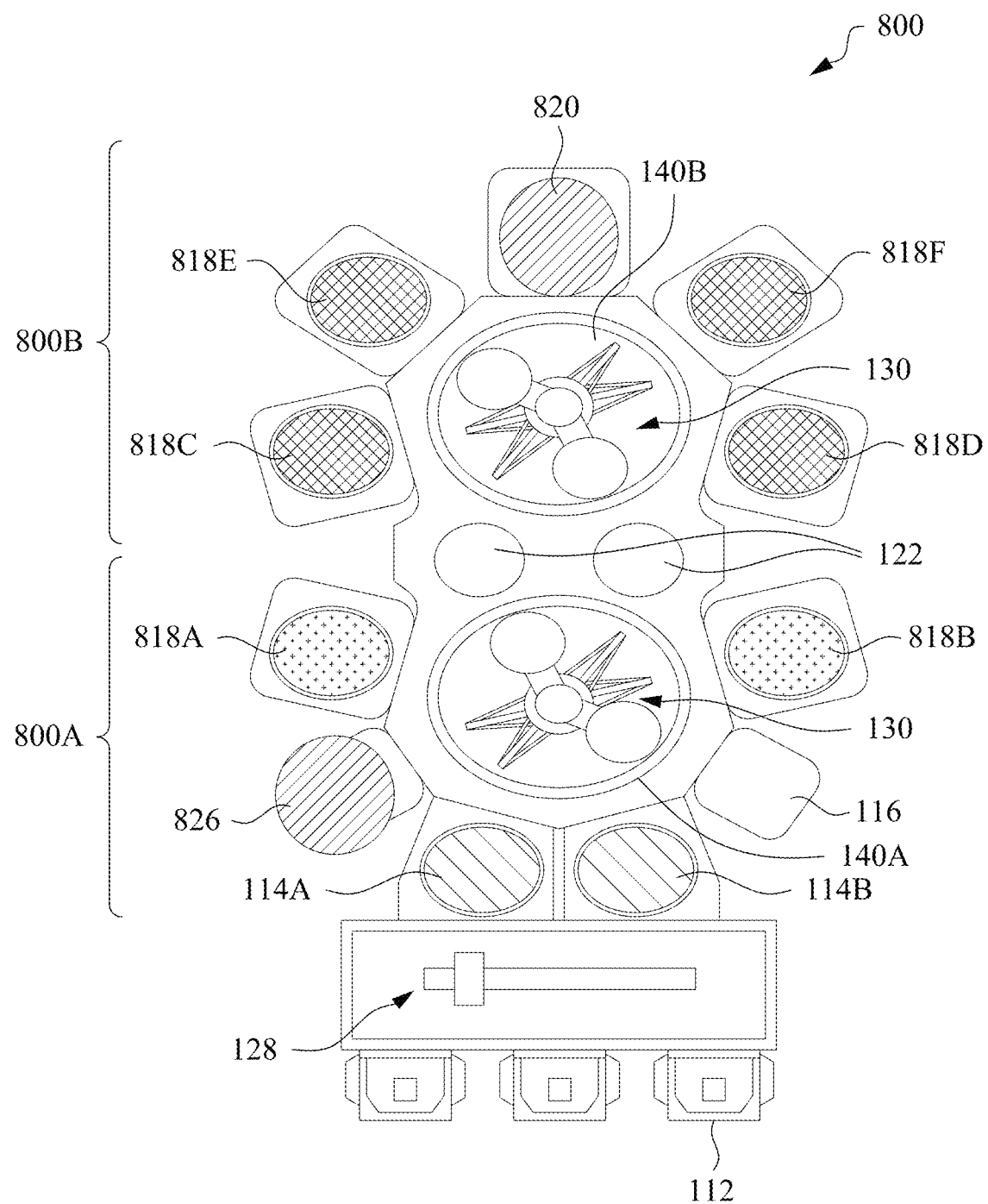
FIG. 8 is a schematic diagram illustrating a semiconductor processing apparatus, in accordance with some embodiments.
Figure 9:
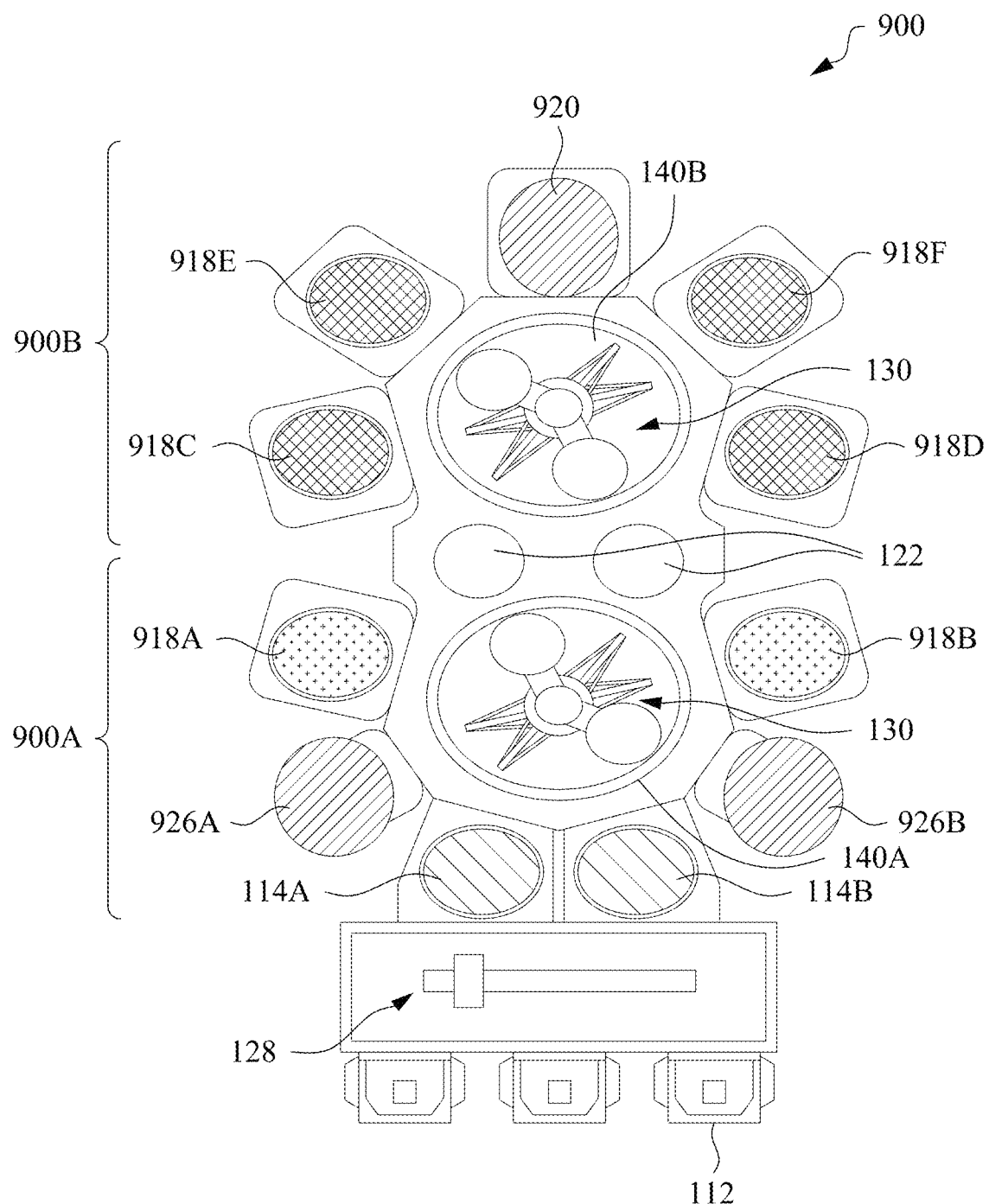
FIG. 9 is a schematic diagram illustrating a semiconductor processing apparatus, in accordance with some embodiments.

FIG. 7 is a schematic diagram illustrating a semiconductor processing apparatus 700, in accordance with one or more embodiments of the present disclosure. FIG. 8 is a schematic diagram illustrating a semiconductor processing apparatus 800, in accordance with one or more embodiments of the present disclosure. FIG. 9 is a schematic diagram illustrating a semiconductor processing apparatus 900, in accordance with one or more embodiments of the present disclosure. Many of the features of the semiconductor processing apparatuses 700, 800, and 900 illustrated in FIGS. 7, 8, and 9, respectively, may be substantially the same or substantially similar to features of the semiconductor processing apparatus 600 previously described herein with respect to FIG. 6, and description of such same or substantially similar features will not be repeated in the following description of the semiconductor processing apparatuses 700, 800, and 900.

As shown in FIG. 7, the semiconductor processing apparatus 700 further includes a plurality of metal gate layer deposition chambers 718A-718G, each of which may be the same or substantially the same as the metal gate layer deposition chambers 618A-618G previously described with respect to FIG. 6.

A difference between the semiconductor processing apparatus 700 and the semiconductor processing apparatus 600 of FIG. 6 is that the semiconductor processing apparatus 700 includes two pre-clean and degas chambers 726A, 726B, which may be included as part of the first cluster 700A of processing chambers. Each of the pre-clean and degas chambers 726A, 726B may be the same or substantially the same as the pre-clean and degas chamber 626 described with respect to FIG. 6.

The inclusion of two pre-clean and degas chambers 726A, 726B in the semiconductor processing apparatus 700 facilitates performance of pre-cleaning (e.g., removal of oxide or other layers) or degassing processes on semiconductor wafers in each of the pre-clean and degas chambers 726A, 726B at the same time. This increases the throughput of processing within the semiconductor processing apparatus 700 in some embodiments. Further, by including the capability of performing both pre-clean and degassing processes in the pre-clean and degas chambers 726A, 726B, it is possible to include additional chambers (e.g., additional metal gate layer deposition chambers) in the apparatus 700 within a same space, e.g., within a limited space of the apparatus 600, as the pre-cleaning and degassing processes may be performed within a same chamber.

The semiconductor processing apparatus 800 shown in FIG. 8 is substantially similar to the semiconductor processing apparatus 700 shown in FIG. 7, except that the semiconductor processing apparatus 800 of FIG. 8 includes a single pre-clean and degas chamber 826, and further includes a degas chamber 116 and a pre-clean chamber 820.

The degas chamber 116 may be the same or substantially the same as the degas chamber 116 described with respect to FIG. 1. The pre-clean and degas chamber 826 may be the same or substantially the same as the pre-clean and degas chamber 626 described with respect to FIG. 6. For example, the pre-clean and degas chamber 826 may include the features and functionalities of both a pre-clean chamber and a degas chamber. The pre-clean chamber 820 may be the same or substantially the same as the pre-clean chamber 120. The semiconductor processing apparatus 800 further includes a plurality of metal gate layer deposition chambers 818A-818F, each of which may be the same or substantially the same as the metal gate layer deposition chambers 118A-118F previously described with respect to FIG. 1.

As shown in FIG. 8, the pre-clean and degas chamber 826 may be included as part of the first cluster 800A, while the pre-clean chamber 820 may be included as part of the second cluster 800B.

The semiconductor processing apparatus 900 shown in FIG. 9 is substantially similar to the semiconductor processing apparatus 800 shown in FIG. 8, except that the semiconductor processing apparatus 900 of FIG. 9 includes two pre-clean and degas chamber 926A, 926B, which may be included as part of the first cluster 900A. A single pre-clean chamber 920 is included as part of the second cluster 900B.

The pre-clean and degas chambers 926A, 926B may be the same or substantially the same as the pre-clean and degas chamber 626 described with respect to FIG. 6. For example, the pre-clean and degas chambers 926A, 926B may include the features and functionalities of both a pre-clean chamber and a degas chamber. The pre-clean chamber 920 may be the same or substantially the same as the pre-clean chamber 120. The semiconductor processing apparatus 900 further includes a plurality of metal gate layer deposition chambers 918A-918F, each of which may be the same or substantially the same as the metal gate layer deposition chambers 118A-118F previously described with respect to FIG. 1.

Although not illustrated, in any of the various embodiments of semiconductor processing apparatuses provided herein, additional components may be included, including, for example, at least one processor, non-transitory computer-readable storage, communication module, I/O devices, an optional display, etc., all of which may be interconnected via a system bus. Software instructions executable by the processor for implementing the methodologies described herein may be stored in the system storage or some other computer-readable medium, or uploaded into such memories from another storage media via wired/wireless methodologies.

Figure 10:
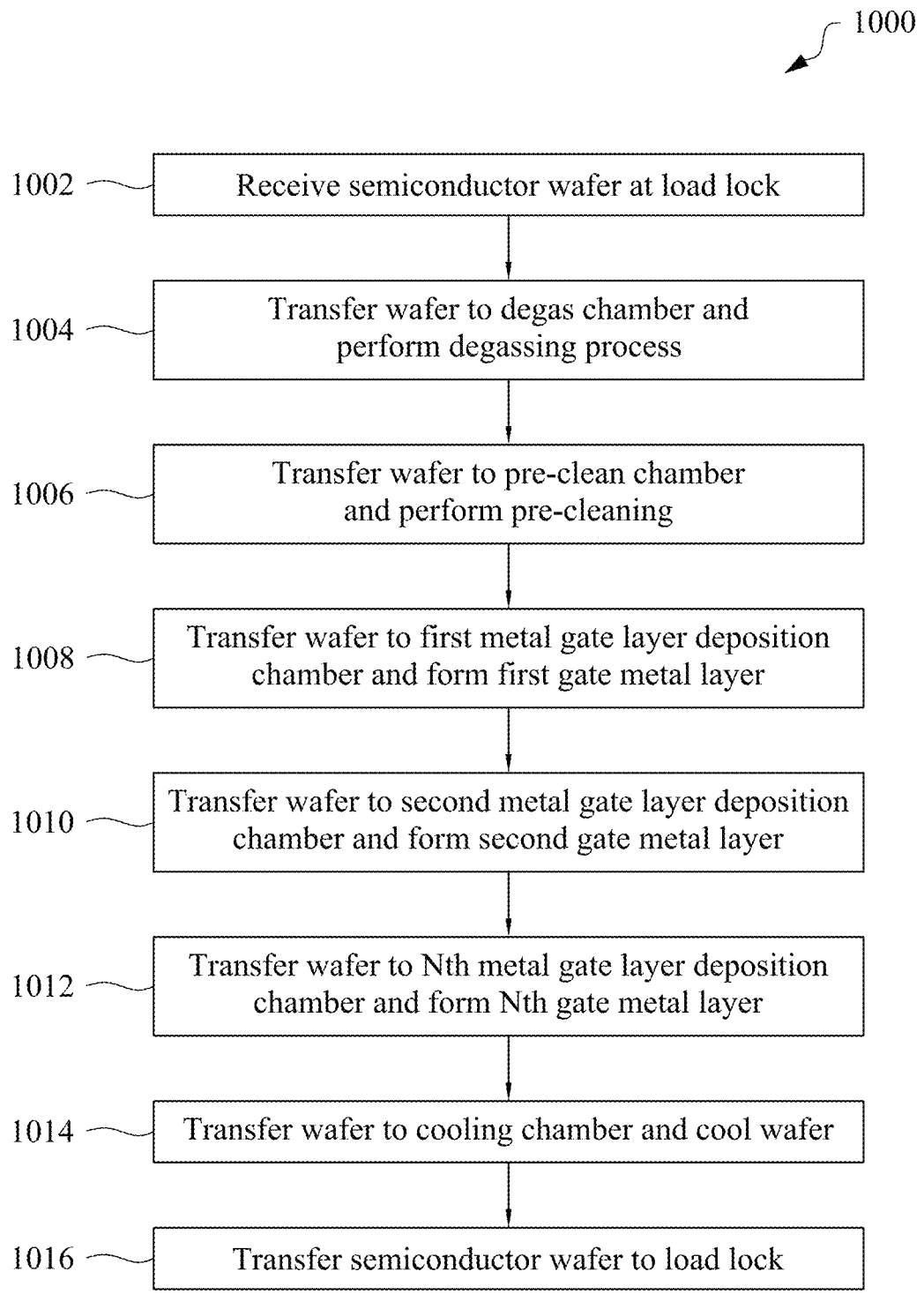
FIG. 10 is a flowchart illustrating a semiconductor processing method, in accordance with some embodiments.

FIG. 10 is a flowchart 1000 illustrating a semiconductor processing method, in accordance with one or more embodiments. The method may be implemented by any of the various semiconductor processing apparatuses described herein, including, for example, by one or more of the semiconductor processing apparatuses 100, 400, 500, 600, 700, 800, or 900 described herein with respect to FIGS. 1, and 4 through 9. In some embodiments, the semiconductor processing method includes a method of forming a metal gate of a semiconductor device.

At 1002, a load lock of the semiconductor processing apparatus receives a semiconductor wafer in a load lock. The load lock may be, for example, any load lock of any of the semiconductor processing apparatuses described herein, such as the load locks 114A, 114B. The semiconductor wafer may be transferred from a load port to the load lock, for example, by a robotic wafer handling device. In some embodiments, the load lock may be vented to a pressure equivalent to a pressure in the load port while a wafer is transferring between the load port and the load lock.

At 1004, the semiconductor wafer is transferred to a degas chamber and a degassing process is performed in the degas chamber. The semiconductor wafer may be transferred, for example, by a robotic wafer handling device of the semiconductor processing apparatus. The degassing chamber may be, for example, any degassing chamber of any of the semiconductor processing apparatuses described herein. In some embodiments, the degassing chamber may be one of the degassing chambers 116, 116A, 116B previously described herein. In some embodiments, the degassing chamber may be one of the pre-clean and degassing chambers 626, 726A, 726B, 826, 926A, 926B. The degassing process may include removing moisture from the semiconductor wafer, e.g., from one or more layers or structures formed on the semiconductor wafer. In some embodiments, degassing processes are performed in the degas chamber at a temperature of within a range of about 100 degrees C. to about 600 degrees C. In some embodiments, the degassing processes are performed in the presence of an ambient gas of Argon (Ar), Helium (He), Nitrogen ($N_2$), Hydrogen ($H_2$), Ammonia ($NH_3$), Ozone ($O_3$), carbon dioxide ($CO_2$), or Oxygen ($O_2$), and at a pressure of about 0.1 Torr to about 10 Torr, as examples. Alternatively, any other suitable processing conditions may be utilized in the degassing processes performed in the degas chamber. In some embodiments, the degassing process may be performed in the presence of a negative pressure or vacuum in order to purge gas from the degas chamber.

At 1006, the semiconductor wafer is transferred to a pre-clean chamber and pre-cleaning is performed on the semiconductor wafer. The semiconductor wafer may be transferred, for example, by a robotic wafer handling device of the semiconductor processing apparatus. In some embodiments, the semiconductor wafer may be transferred to a pre-clean chamber by a wafer handling robot 130 of a buffer chamber, such as the first buffer chamber 140A. The pre-clean chamber may be, for example, any pre-clean chamber of any of the semiconductor processing apparatuses described herein. In some embodiments, the pre-clean chamber is configured to at least partially remove an oxide layer or undesired film that is formed on the semiconductor wafer (e.g., on one or more metal layers of the wafer). In some embodiments, the pre-clean chamber may be a reactive plasma clean (RPC) chamber or an Aktiv™ preclean (APC) chamber.

At 1008, the semiconductor wafer is transferred to a first metal gate layer deposition chamber and a first metal gate layer is formed on the semiconductor wafer. The semiconductor wafer may be transferred, for example, by a robotic wafer handling device of the semiconductor processing apparatus, such as by a wafer handling robot 130 of the first buffer chamber 140A or the second buffer chamber 140B. The first metal gate layer deposition chamber may be any of the various metal gate deposition chambers described herein with respect to various embodiments. In various embodiments, the first metal gate layer deposition chamber may be disposed as part of either a first or second cluster of the semiconductor processing apparatus. The first metal gate layer may be any layer or film that is formed as part of processing to form a metal gate for a semiconductor device. In various embodiments, the first metal gate layer may be a high-k dielectric layer, a barrier layer or diffusion prevention layer, a high-k capping layer, or any metal gate layer. The first metal gate layer may be formed by one or more of chemical vapor deposition (CVD), physical vapor deposition (PVD), or atomic layer deposition (ALD) processes.

At 1010, the semiconductor wafer is transferred to a second metal gate layer deposition chamber and a second metal gate layer is formed on the semiconductor wafer, for example, on the first metal gate layer. The semiconductor wafer may be transferred, for example, by a robotic wafer handling device of the semiconductor processing apparatus, such as by a wafer handling robot 130 of the first buffer chamber 140A or the second buffer chamber 140B. The second metal gate layer deposition chamber may be any of the various metal gate deposition chambers described herein with respect to various embodiments. In various embodiments, the second metal gate layer deposition chamber may be disposed as part of either a first or second cluster of the semiconductor processing apparatus. The second metal gate layer may be any layer or film that is formed as part of processing to form a metal gate for a semiconductor device. In various embodiments, the second metal gate layer may be a high-k dielectric layer, a barrier layer or diffusion prevention layer, a high-k capping layer, or any metal gate layer. The second metal gate layer may be formed by one or more of chemical vapor deposition (CVD), physical vapor deposition (PVD), or atomic layer deposition (ALD) processes.

At 1012, the semiconductor wafer is transferred to an Nth metal gate layer deposition chamber and an Nth metal gate layer is formed on the semiconductor wafer, for example, on an N−1th metal gate layer. More particularly, any integer number of metal gate layers may be formed on the semiconductor wafer in accordance with the methods provided herein. After formation of the second metal gate layer at 1010, any number of additional metal gate layers may be formed on the second metal gate layer, for example, by transferring the semiconductor wafer to any of the metal gate layer deposition chambers of the semiconductor processing apparatus provided herein.

The semiconductor wafer may be transferred, for example, by a robotic wafer handling device of the semiconductor processing apparatus, such as by a wafer handling robot 130 of the first buffer chamber 140A or the second buffer chamber 140B. The Nth metal gate layer deposition chamber may be any of the various metal gate deposition chambers described herein with respect to various embodiments. In various embodiments, the Nth metal gate layer deposition chamber may be disposed as part of either a first or second cluster of the semiconductor processing apparatus. The Nth metal gate layer may be any layer or film that is formed as part of processing to form a metal gate for a semiconductor device. In various embodiments, the Nth metal gate layer may be a high-k dielectric layer, a barrier layer or diffusion prevention layer, a high-k capping layer, or any metal gate layer. The Nth metal gate layer may be formed by one or more of chemical vapor deposition (CVD), physical vapor deposition (PVD), or atomic layer deposition (ALD) processes.

At 1014, the semiconductor wafer is transferred to a cooling chamber and the semiconductor wafer is cooled to a selected temperature, which may be selected based on design considerations such as the composition of the deposited layers, a type of semiconductor wafer or semiconductor devices formed on the wafer, or the like. The semiconductor wafer may be transferred to the cooling chamber, for example, by a robotic wafer handling device of the semiconductor processing apparatus, such as by a wafer handling robot 130 of the first buffer chamber 140A or the second buffer chamber 140B.

At 1016, the semiconductor wafer is transferred from the cooling chamber to the load lock. The semiconductor wafer may then be returned, for example, to a load port or to a FOUP in the load port, where the semiconductor wafer may be transferred to another apparatus for further processing, or the like.

Figure 11:
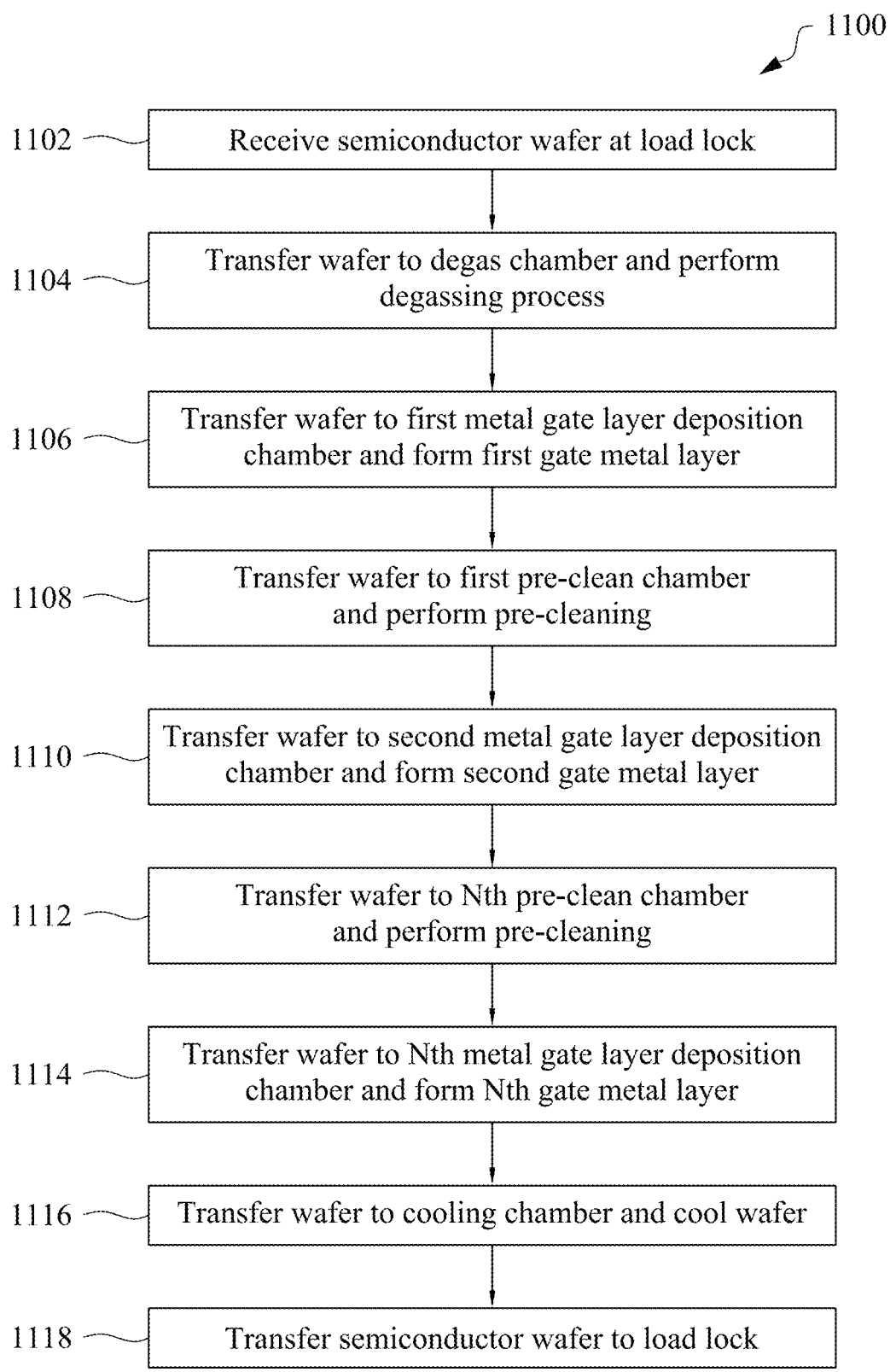
FIG. 11 is a flowchart illustrating a semiconductor processing method, in accordance with some embodiments.

FIG. 11 is a flowchart 1100 illustrating a semiconductor processing method, in accordance with one or more embodiments. The method may be implemented by any of the various semiconductor processing apparatuses described herein, including, for example, by one or more of the semiconductor processing apparatuses 100, 400, 500, 600, 700, 800, or 900 described herein with respect to FIGS. 1, and 4 through 9. In some embodiments, the semiconductor processing method includes a method of forming a metal gate of a semiconductor device.

At 1102, a load lock of the semiconductor processing apparatus receives a semiconductor wafer in a load lock. The load lock may be, for example, any load lock of any of the semiconductor processing apparatuses described herein, such as the load locks 114A, 114B. The semiconductor wafer may be transferred from a load port to the load lock, for example, by a robotic wafer handling device. In some embodiments, the load lock may be vented to a pressure equivalent to a pressure in the load port while a wafer is transferring between the load port and the load lock.

At 1104, the semiconductor wafer is transferred to a degas chamber and a degassing process is performed in the degas chamber. The degassing chamber may be, for example, any degassing chamber of any of the semiconductor processing apparatuses described herein. In some embodiments, the degassing chamber may be one of the degassing chambers 116, 116A, 116B previously described herein. In some embodiments, the degassing chamber may be one of the pre-clean and degassing chambers 626, 726A, 726B, 826, 926A, 926B. The degassing process may include removing moisture from the semiconductor wafer, e.g., from one or more layers or structures formed on the semiconductor wafer.

At 1106, the semiconductor wafer is transferred from the degas chamber to a first metal gate layer deposition chamber and a first metal gate layer is formed on the semiconductor wafer. The semiconductor wafer may be transferred, for example, by a robotic wafer handling device of the semiconductor processing apparatus, such as by a wafer handling robot 130 of the first buffer chamber 140A or the second buffer chamber 140B. The first metal gate layer deposition chamber may be any of the various metal gate deposition chambers described herein with respect to various embodiments. In various embodiments, the first metal gate layer deposition chamber may be disposed as part of either a first or second cluster of the semiconductor processing apparatus. The first metal gate layer may be any layer or film that is formed as part of processing to form a metal gate for a semiconductor device. In various embodiments, the first metal gate layer may be a high-k dielectric layer, a barrier layer or diffusion prevention layer, a high-k capping layer, or any metal gate layer. The first metal gate layer may be formed by one or more of chemical vapor deposition (CVD), physical vapor deposition (PVD), or atomic layer deposition (ALD) processes.

At 1108, the semiconductor wafer is transferred to a first pre-clean chamber and pre-cleaning is performed on the semiconductor wafer. The semiconductor wafer may be transferred, for example, by a robotic wafer handling device of the semiconductor processing apparatus. The first pre-clean chamber may be, for example, any pre-clean chamber of any of the semiconductor processing apparatuses described herein. In some embodiments, the first pre-clean chamber is configured to at least partially remove an oxide layer or undesired film that is formed on the semiconductor wafer (e.g., on one or more metal layers of the wafer). In some embodiments, the first pre-clean chamber may be a reactive plasma clean (RPC) chamber or an Aktiv™ pre-clean (APC) chamber.

In some embodiments, after processing of the semiconductor wafer in the first pre-clean chamber, the thickness of the oxide layer on the first metal gate layer is less than 1 nm. In some embodiments, after processing of the semiconductor wafer in the first pre-clean chamber, the thickness of the oxide layer on the first metal gate layer is less than 0.01 nm, and in some embodiments, after processing of the semiconductor wafer in the first pre-clean chamber, the thickness of the oxide layer on the first metal gate layer is less than 0.001 nm. In various embodiments, the thickness of the oxide layer may have other values, and such values for the thickness of the oxide layer are within the scope of the disclosure.

At 1110, the semiconductor wafer is transferred to a second metal gate layer deposition chamber and a second metal gate layer is formed on the semiconductor wafer, for example, on the first metal gate layer. The second metal gate layer deposition chamber may be any of the various metal gate deposition chambers described herein with respect to various embodiments. In various embodiments, the second metal gate layer deposition chamber may be disposed as part of either a first or second cluster of the semiconductor processing apparatus. The second metal gate layer may be any layer or film that is formed as part of processing to form a metal gate for a semiconductor device. In various embodiments, the second metal gate layer may be a high-k dielectric layer, a barrier layer or diffusion prevention layer, a high-k capping layer, or any metal gate layer. The second metal gate layer may be formed by one or more of chemical vapor deposition (CVD), physical vapor deposition (PVD), or atomic layer deposition (ALD) processes.

Any number of pre-clean processes and metal gate layer deposition processes may be performed on the semiconductor wafer, for example, by repeating the sequence shown and described at 1106 and 1108.

At 1112, the semiconductor wafer is transferred to an Nth pre-clean chamber and pre-cleaning is performed on the semiconductor wafer. The semiconductor wafer may be transferred, for example, by a robotic wafer handling device of the semiconductor processing apparatus. The Nth pre-clean chamber may be, for example, any pre-clean chamber of any of the semiconductor processing apparatuses described herein. In some embodiments, the Nth pre-clean chamber is configured to at least partially remove an oxide layer or undesired film that is formed on the semiconductor wafer (e.g., on one or more metal layers of the wafer). In some embodiments, the Nth pre-clean chamber may be a reactive plasma clean (RPC) chamber or an Aktiv™ pre-clean (APC) chamber.

In some embodiments, after processing of the semiconductor wafer in the Nth pre-clean chamber, the thickness of the oxide layer on a last formed metal gate layer (e.g., an N−1th metal gate layer) is less than 1 nm. In some embodiments, after processing of the semiconductor wafer in the pre-clean chamber, the thickness of the oxide layer on the last formed metal gate layer is less than 0.01 nm, and in some embodiments, after processing of the semiconductor wafer in the pre-clean chamber, the thickness of the oxide layer on the last formed metal gate layer is less than 0.001 nm. In various embodiments, the thickness of the oxide layer may have other values, and such values for the thickness of the oxide layer are within the scope of the disclosure.

At 1114, the semiconductor wafer is transferred to an Nth metal gate layer deposition chamber and an Nth metal gate layer is formed on the semiconductor wafer, for example, on an N−1th metal gate layer. More particularly, any integer number of metal gate layers may be formed on the semiconductor wafer in accordance with the methods provided herein. After formation of the second metal gate layer at 1110, any number of additional metal gate layers may be formed on the second metal gate layer, for example, by transferring the semiconductor wafer to any of the metal gate layer deposition chambers of the semiconductor processing apparatus provided herein.

The semiconductor wafer may be transferred, for example, by a robotic wafer handling device of the semiconductor processing apparatus, such as by a wafer handling robot 130 of the first buffer chamber 140A or the second buffer chamber 140B. The Nth metal gate layer deposition chamber may be any of the various metal gate deposition chambers described herein with respect to various embodiments. In various embodiments, the Nth metal gate layer deposition chamber may be disposed as part of either a first or second cluster of the semiconductor processing apparatus. The Nth metal gate layer may be any layer or film that is formed as part of processing to form a metal gate for a semiconductor device. In various embodiments, the Nth metal gate layer may be a high-k dielectric layer, a barrier layer or diffusion prevention layer, a high-k capping layer, or any metal gate layer.

At 1116, the semiconductor wafer is transferred to a cooling chamber and the semiconductor wafer is cooled to a selected temperature, which may be selected based on design considerations such as the composition of the deposited layers, a type of semiconductor wafer or semiconductor devices formed on the wafer, or the like. The semiconductor wafer may be transferred to the cooling chamber, for example, by a robotic wafer handling device of the semiconductor processing apparatus, such as by a wafer handling robot 130 of the first buffer chamber 140A or the second buffer chamber 140B.

At 1118, the semiconductor wafer is transferred from the cooling chamber to the load lock. The semiconductor wafer may then be returned, for example, to a load port or to a FOUP in the load port, where the semiconductor wafer may be transferred to another apparatus for further processing, or the like.

Figure 12:
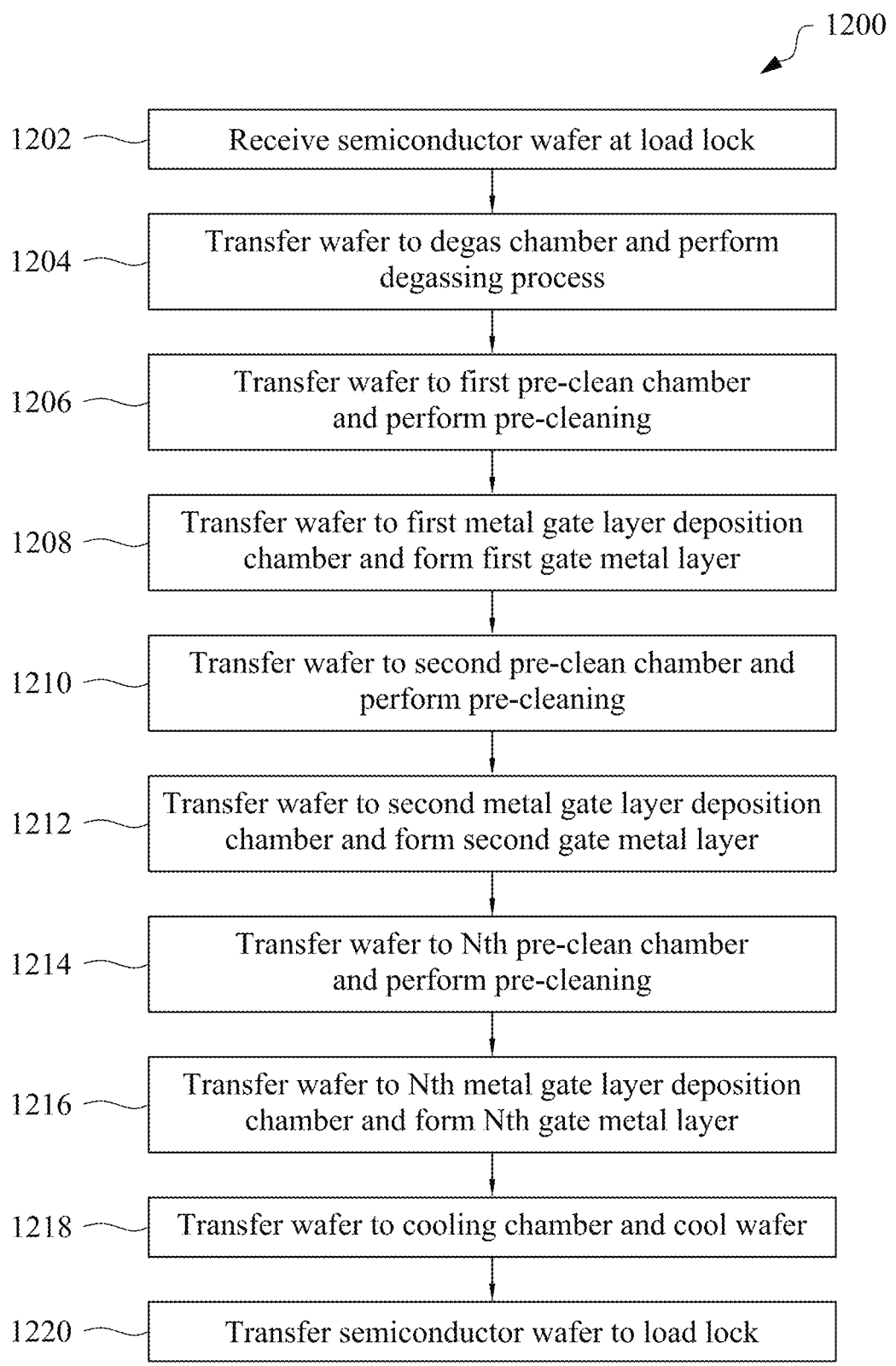
FIG. 12 is a flowchart illustrating a semiconductor processing method, in accordance with some embodiments.

FIG. 12 is a flowchart 1200 illustrating a semiconductor processing method, in accordance with one or more embodiments. The method may be implemented by any of the various semiconductor processing apparatuses described herein, including, for example, by one or more of the semiconductor processing apparatuses 100, 400, 500, 600, 700, 800, or 900 described herein with respect to FIGS. 1, and 4 through 9. In some embodiments, the semiconductor processing method includes a method of forming a metal gate of a semiconductor device.

At 1202, a load lock of the semiconductor processing apparatus receives a semiconductor wafer in a load lock. The load lock may be, for example, any load lock of any of the semiconductor processing apparatuses described herein, such as the load locks 114A, 114B. The semiconductor wafer may be transferred from a load port to the load lock, for example, by a robotic wafer handling device. In some embodiments, the load lock may be vented to a pressure equivalent to a pressure in the load port while a wafer is transferring between the load port and the load lock.

At 1204, the semiconductor wafer is transferred to a degas chamber and a degassing process is performed in the degas chamber. The degassing chamber may be, for example, any degassing chamber of any of the semiconductor processing apparatuses described herein. In some embodiments, the degassing chamber may be one of the degassing chambers 116, 116A, 116B previously described herein. In some embodiments, the degassing chamber may be one of the pre-clean and degassing chambers 626, 726A, 726B, 826, 926A, 926B. The degassing process may include removing moisture from the semiconductor wafer, e.g., from one or more layers or structures formed on the semiconductor wafer.

At 1206, the semiconductor wafer is transferred to a first pre-clean chamber and pre-cleaning is performed on the semiconductor wafer. The semiconductor wafer may be transferred, for example, by a robotic wafer handling device of the semiconductor processing apparatus. The first pre-clean chamber may be, for example, any pre-clean chamber of any of the semiconductor processing apparatuses described herein. In some embodiments, the pre-clean chamber is configured to at least partially remove an oxide layer or undesired film that is formed on the semiconductor wafer (e.g., on one or more metal layers of the wafer). In some embodiments, the pre-clean chamber may be a reactive plasma clean (RPC) chamber or an Aktiv™ preclean (APC) chamber.

At 1208, the semiconductor wafer is transferred from the first pre-clean chamber to a first metal gate layer deposition chamber and a first metal gate layer is formed on the semiconductor wafer. The semiconductor wafer may be transferred, for example, by a robotic wafer handling device of the semiconductor processing apparatus, such as by a wafer handling robot 130 of the first buffer chamber 140A or the second buffer chamber 140B. The first metal gate layer deposition chamber may be any of the various metal gate deposition chambers described herein with respect to various embodiments. In various embodiments, the first metal gate layer deposition chamber may be disposed as part of either a first or second cluster of the semiconductor processing apparatus. The first metal gate layer may be any layer or film that is formed as part of processing to form a metal gate for a semiconductor device. In various embodiments, the first metal gate layer may be a high-k dielectric layer, a barrier layer or diffusion prevention layer, a high-k capping layer, or any metal gate layer. The first metal gate layer may be formed by one or more of chemical vapor deposition (CVD), physical vapor deposition (PVD), or atomic layer deposition (ALD) processes.

At 1210, the semiconductor wafer is transferred to a second pre-clean chamber and pre-cleaning is performed on the semiconductor wafer. The semiconductor wafer may be transferred, for example, by a robotic wafer handling device of the semiconductor processing apparatus. The second pre-clean chamber may be, for example, any pre-clean chamber of any of the semiconductor processing apparatuses described herein. In some embodiments, the second pre-clean chamber is configured to at least partially remove an oxide layer or undesired film that is formed on the semiconductor wafer (e.g., on the first metal gate layer of the wafer). In some embodiments, the second pre-clean chamber may be a reactive plasma clean (RPC) chamber or an Aktiv™ preclean (APC) chamber.

In some embodiments, after processing of the semiconductor wafer in the second pre-clean chamber, the thickness of the oxide layer on the first metal gate layer is less than 1 nm. In some embodiments, after processing of the semiconductor wafer in the second pre-clean chamber, the thickness of the oxide layer on the first metal gate layer is less than 0.01 nm, and in some embodiments, after processing of the semiconductor wafer in the second pre-clean chamber, the thickness of the oxide layer on the first metal gate layer is less than 0.001 nm. In various embodiments, the thickness of the oxide layer may have other values, and such values for the thickness of the oxide layer are within the scope of the disclosure.

At 1212, the semiconductor wafer is transferred to a second metal gate layer deposition chamber and a second metal gate layer is formed on the semiconductor wafer, for example, on the first metal gate layer. The second metal gate layer deposition chamber may be any of the various metal gate deposition chambers described herein with respect to various embodiments. In various embodiments, the second metal gate layer deposition chamber may be disposed as part of either a first or second cluster of the semiconductor processing apparatus. The second metal gate layer may be any layer or film that is formed as part of processing to form a metal gate for a semiconductor device. In various embodiments, the second metal gate layer may be a high-k dielectric layer, a barrier layer or diffusion prevention layer, a high-k capping layer, or any metal gate layer. The second metal gate layer may be formed by one or more of chemical vapor deposition (CVD), physical vapor deposition (PVD), or atomic layer deposition (ALD) processes.

Any number of pre-clean processes and metal gate layer deposition processes may be performed on the semiconductor wafer, for example, by repeating the sequence shown and described at 1210 and 1212.

At 1214, the semiconductor wafer is transferred to an Nth pre-clean chamber and pre-cleaning is performed on the semiconductor wafer. The semiconductor wafer may be transferred, for example, by a robotic wafer handling device of the semiconductor processing apparatus. The Nth pre-clean chamber may be, for example, any pre-clean chamber of any of the semiconductor processing apparatuses described herein. In some embodiments, the Nth pre-clean chamber is configured to at least partially remove an oxide layer or undesired film that is formed on the semiconductor wafer (e.g., on one or more metal layers of the wafer). In some embodiments, the Nth pre-clean chamber may be a reactive plasma clean (RPC) chamber or an Aktiv™ preclean (APC) chamber.

In some embodiments, after processing of the semiconductor wafer in the Nth pre-clean chamber, the thickness of the oxide layer on a last formed metal gate layer (e.g., an N–1th metal gate layer) is less than 1 nm. In some embodiments, after processing of the semiconductor wafer in the pre-clean chamber, the thickness of the oxide layer on the last formed metal gate layer is less than 0.01 nm, and in some embodiments, after processing of the semiconductor wafer in the pre-clean chamber, the thickness of the oxide layer on the last formed metal gate layer is less than 0.001 nm. In various embodiments, the thickness of the oxide layer may have other values, and such values for the thickness of the oxide layer are within the scope of the disclosure.

At 1216, the semiconductor wafer is transferred to an Nth metal gate layer deposition chamber and an Nth metal gate layer is formed on the semiconductor wafer, for example, on an N–1th metal gate layer. More particularly, any integer number of metal gate layers may be formed on the semiconductor wafer in accordance with the methods provided herein. After formation of the second metal gate layer at 1212, any number of additional metal gate layers may be formed on the second metal gate layer, for example, by transferring the semiconductor wafer to any of the metal gate layer deposition chambers of the semiconductor processing apparatus provided herein.

The semiconductor wafer may be transferred, for example, by a robotic wafer handling device of the semiconductor processing apparatus, such as by a wafer handling robot 130 of the first buffer chamber 140A or the second buffer chamber 140B. The Nth metal gate layer deposition chamber may be any of the various metal gate deposition chambers described herein with respect to various embodiments. In various embodiments, the Nth metal gate layer deposition chamber may be disposed as part of either a first or second cluster of the semiconductor processing apparatus. The Nth metal gate layer may be any layer or film that is formed as part of processing to form a metal gate for a semiconductor device. In various embodiments, the Nth metal gate layer may be a high-k dielectric layer, a barrier layer or diffusion prevention layer, a high-k capping layer, or any metal gate layer.

At 1218, the semiconductor wafer is transferred to a cooling chamber and the semiconductor wafer is cooled to a selected temperature, which may be selected based on design considerations such as the composition of the deposited layers, a type of semiconductor wafer or semiconductor devices formed on the wafer, or the like. The semiconductor wafer may be transferred to the cooling chamber, for example, by a robotic wafer handling device of the semiconductor processing apparatus, such as by a wafer handling robot 130 of the first buffer chamber 140A or the second buffer chamber 140B.

At 1220, the semiconductor wafer is transferred from the cooling chamber to the load lock. The semiconductor wafer may then be returned, for example, to a load port or to a FOUP in the load port, where the semiconductor wafer may be transferred to another apparatus for further processing, or the like.

With reference to the flowcharts illustrated in FIGS. 10 through 12, in various embodiments of the present disclosure, any of the first through Nth metal gate layers may be formed in a same metal gate deposition chamber. For example, after a first metal gate layer is formed in a first metal gate layer deposition chamber, the semiconductor wafer may be transferred to another chamber (e.g., a pre-clean chamber) and may be returned to the first metal gate layer deposition chamber for formation of any of a second through Nth metal gate layer. Similarly, in various embodiments, any of the first through Nth pre-cleaning processes may be performed in a same pre-clean chamber.

Figure 13:
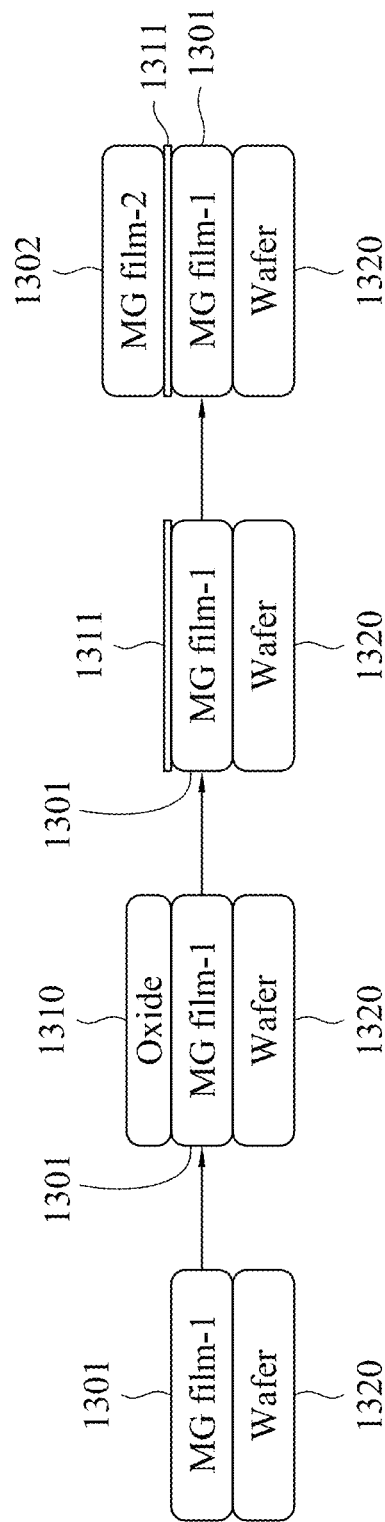
FIG. 13 is a schematic diagram illustrating a method of forming a metal gate structure, in accordance with some embodiments.

FIG. 13 schematically illustrates a method of forming a metal gate structure, in accordance with one or more embodiments. As shown in FIG. 13, a first metal gate layer 1301 is formed on a semiconductor wafer 1320. The first metal gate layer be any layer or film that is formed as part of processing to form a metal gate for a semiconductor device. In various embodiments, the first metal gate layer may be a high-k dielectric layer, a barrier layer or diffusion prevention layer, a high-k capping layer, or any metal gate layer. The first metal gate layer may be formed in a metal gate layer deposition chamber, for example, by one or more of chemical vapor deposition (CVD), physical vapor deposition (PVD), or atomic layer deposition (ALD) processes. In some embodiments, the first metal gate layer has a thickness that is less than 50 nm. In some embodiments, the first metal gate layer has a thickness that is less than 10 nm. In some embodiments, the first metal gate layer has a thickness that is less than 3 nm. In various embodiments, the thickness of the first metal gate layer may have other values, and all such values for the thickness of the first metal gate layer are within the scope of the disclosure.

After formation of the first metal gate layer 1301, an oxide layer 1310 may be undesirably formed on the first metal gate layer 1301. The oxide layer 1310 (which in some embodiments may be an oxide film or other undesired film or layer of material) may form on the first metal gate layer 1301, for example, by chemical reaction of the first metal gate layer 1301 with one or more elements or substances during processing of the semiconductor wafer 1320 after the formation of the first metal gate layer 1301. For example, after the first metal gate layer 1301 is formed, an oxide film may begin to form on the first metal gate layer 1301 while the semiconductor wafer 1320 is transferred to another chamber of the semiconductor processing apparatus or during a hold or wait time before formation of a second metal gate layer.

The oxide layer 1310 may be substantially removed, or at least partially removed, for example, by processing in a pre-clean chamber. In some embodiments, processing of the semiconductor wafer 1320 in the pre-clean chamber may include reducing a thickness of the oxide layer 1310 by at least 50%. In some embodiments, processing of the semiconductor wafer 1320 in the pre-clean chamber may include reducing a thickness of the oxide layer by at least 80%, and in some embodiments, processing of the semiconductor wafer 1320 in the pre-clean chamber may include reducing a thickness of the oxide layer by at least 90%. In various embodiments, processing of the semiconductor wafer in the pre-clean chamber may include reducing a thickness of the oxide layer by any value or percentage, and such values or percentages are within the scope of the disclosure. In some embodiments, processing of the semiconductor wafer 1320 in the pre-clean chamber may include substantially removing an entirety of the oxide layer.

The remaining oxide layer 1311, if any, after processing in the pre-clean chamber has a reduced thickness with respect to the thickness of the oxide layer 1310. In some embodiments, after processing of the semiconductor wafer 1320 in the pre-clean chamber, the thickness of the oxide layer 1311 on the first metal gate layer 1301 is less than 1 nm. In some embodiments, after processing of the semiconductor wafer 1320 in the pre-clean chamber, the thickness of the oxide layer 1311 on the first metal gate layer 1301 is less than 0.01 nm, and in some embodiments, after processing of the semiconductor wafer 1320 in the pre-clean chamber, the thickness of the oxide layer 1311 on the first metal gate layer 1301 is less than 0.001 nm. In various embodiments, the thickness of the oxide layer may have other values, and all such values for the thickness of the oxide layer are within the scope of the disclosure.

A second metal gate layer 1302 is formed on the oxide layer 1311, if present, or may be formed directly on the first metal gate layer 1301 after removal of the oxide layer 1311. The second metal gate layer 1302 be any layer or film that is formed as part of processing to form a metal gate for a semiconductor device. In various embodiments, the second metal gate layer 1302 may be a high-k dielectric layer, a barrier layer or diffusion prevention layer, a high-k capping layer, or any metal gate layer. The second metal gate layer 1302 may be formed in a metal gate layer deposition chamber, for example, by one or more of chemical vapor deposition (CVD), physical vapor deposition (PVD), or atomic layer deposition (ALD) processes. In some embodiments, the second metal gate layer has a thickness that is less than 50 nm. In some embodiments, the second metal gate layer has a thickness that is less than 10 nm. In some embodiments, the second metal gate layer has a thickness that is less than 3 nm. In various embodiments, the thickness of the second metal gate layer may have other values, and all such values for the thickness of the second metal gate layer are within the scope of the disclosure.

In various embodiments provided herein, semiconductor processing apparatuses and methods facilitate reduction or removal of an oxide or other undesirable layer on one or more of metal layers of a metal gate structure. The inclusion of a pre-clean chamber within the same semiconductor processing apparatus as one or more metal gate layer deposition chambers facilitates removal of an oxide layer from a surface of the metal gate layer without transferring the semiconductor wafer to a separate semiconductor processing tool or apparatus. Accordingly, as the oxide layer has been reduced or removed (e.g., between first and second metal gate layers), the properties and performance of a metal gate including the first and second metal gate layers may be improved. Moreover, due to reduction or removal of the oxide layer, the thickness and composition of the metal gates formed on various devices may be substantially the same even on different semiconductor wafers which may be processed by the semiconductor processing apparatus, thereby facilitating formation of metal gates having a substantially uniform thickness and composition. This also results in substantially uniform device performance from device-to-device as the metal gates are substantially uniform, such as, for example, substantially uniform threshold voltage, saturation current, and on resistance of transistors including metal gates.

According to one embodiment, a semiconductor processing apparatus includes a plurality of metal gate layer deposition chambers. Each of the metal gate layer deposition chambers is configured to form a metal gate layer on a semiconductor wafer. The semiconductor processing apparatus further includes at least one pre-clean chamber that is configured to receive the semiconductor wafer from one of the metal gate layer deposition chamber and at least partially remove an oxide layer on the metal gate layer.

According to another embodiment, a method is provided that includes forming a first metal gate layer on a semiconductor wafer, in a first metal gate layer deposition chamber of a semiconductor processing apparatus. The semiconductor wafer is transferred to a first pre-clean chamber of the semiconductor processing apparatus. The method includes at least partially removing an oxide layer on a surface of the first metal gate layer, in the first pre-clean chamber.

According to yet another embodiment, a semiconductor processing apparatus includes a load/unload port configured to receive a semiconductor wafer. A first wafer handling robot is configured to transport the semiconductor wafer from the load/unload port to a load lock. A first cluster of process chambers includes a first degassing chamber and a first metal layer deposition chamber. A second wafer handling robot is configured to transport the semiconductor wafer from the load lock to the first cluster of process chambers. A second cluster of process chambers includes a second metal layer deposition chamber. A third wafer handling robot is configured to transport the semiconductor wafer from the first cluster of process chambers to the second cluster of process chambers. At least one of the first cluster of process chambers or the second cluster of process chambers includes a pre-clean chamber configured to at least partially remove an oxide layer on a metal gate layer of the semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    transferring a wafer to a first metal gate layer deposition chamber of a first cluster of process chambers of a semiconductor processing apparatus;
    transferring, with a first wafer handling robot arm, the wafer from the first metal gate layer deposition chamber of the first cluster of process chambers;
    transferring the wafer from a first pre-clean chamber to a second metal gate layer deposition chamber of a second cluster of process chambers of the semiconductor processing apparatus; and
    transferring, with a second wafer handling robot arm, the wafer from the second metal gate layer deposition chamber to a second pre-clean chamber of the second cluster of process chambers.

2. The method of claim 1, further comprising:
    forming a first metal gate layer on the semiconductor wafer in the first metal gate layer deposition chamber;
    at least partially removing the first oxide layer on a surface of the first metal gate layer in the first pre-clean chamber;
    forming a second metal gate layer on the first metal gate layer in the second metal gate layer deposition chamber; and
    at least partially removing a second oxide layer on a surface of the second metal gate layer, in the second pre-clean chamber.

3. The method of claim 2, wherein the at least partially removing the first oxide layer on a surface of the first metal gate layer includes reducing a thickness of the first oxide layer to less than 1 nm.

4. The method of claim 2, wherein the at least partially removing the first oxide layer on a surface of the first metal gate layer includes reducing a thickness of the oxide layer to less than 0.001 nm.

5. The method of claim 2, wherein the at least partially removing the first oxide layer on a surface of the first metal gate layer includes reducing a thickness of the oxide layer by at least 90%.

6. The method of claim 2, further comprising:
    forming a third metal gate layer on the second metal gate layer.

7. The method of claim 6, wherein the forming the first metal gate layer includes:
    forming one of a high-k dielectric layer, a barrier layer, a diffusion prevention layer, or a high-k capping layer, and
    wherein the forming the second metal gate layer includes forming a different one of a high-k dielectric layer, a barrier layer, a diffusion prevention layer, or a high-k capping layer.

8. The method of claim 6, further comprising:
    transferring the semiconductor wafer to the second metal gate layer deposition chamber of the semiconductor processing apparatus, after the at least partially removing the second oxide layer,
    wherein the forming the third metal gate layer on the second metal gate layer includes forming the third metal gate layer in the second metal gate layer deposition chamber.

9. The method of claim 6, further comprising transferring the semiconductor wafer to a third metal gate layer deposition chamber of the second cluster of process chambers, wherein the forming the third metal gate layer on the first metal gate layer includes forming the second metal gate layer in the second metal gate layer deposition chamber.

10. The method of claim 9, further comprising:
    transferring the semiconductor wafer to the second pre-clean chamber; and
    at least partially removing a third oxide layer on a surface of the third metal gate layer, in the second pre-clean chamber.

11. The method of claim 2, further comprising degassing the semiconductor wafer in in a vacuum in the first pre-clean chamber.

12. The method of claim 2, wherein the forming the second metal gate layer includes forming the first metal gate layer by at least one of physical vapor deposition (PVD), chemical vapor deposition (CVD), or atomic layer deposition (ALD).

13. A semiconductor processing apparatus, comprising:
a first load lock;
a second load lock;
a first wafer handling robot configured to transport the semiconductor wafer from a load/unload port to the first load lock;
a first cluster of process chambers including a first joint pre-clean and degas chamber, a pre-clean chamber, and a first metal layer deposition chamber;
a second wafer handling robot configured to transport the semiconductor wafer from the first load lock to the first cluster of process chambers;
a second cluster of process chambers including a second metal layer deposition chamber and a second pre-clean chamber; and
a third wafer handling robot configured to transport the semiconductor wafer from the first cluster of process chambers to the second cluster of process chambers.

14. The semiconductor processing apparatus of claim 12, wherein the second cluster of process chambers includes a third metal gate layer deposition chamber, wherein the second pre-clean chamber is arranged between the second and third metal gate layer deposition chambers.

15. The semiconductor processing apparatus of claim 12, wherein the first metal gate layer is at least one of a high-k dielectric layer, a barrier layer, a diffusion prevention layer, or a high-k capping layer.

16. The semiconductor processing apparatus of claim 12, wherein the first pre-clean chamber includes a reactive plasma clean chamber or an Aktiv pre-clean chamber.

17. The semiconductor processing apparatus of claim 12, wherein the first pre-clean chamber is a combined pre-clean and degassing chamber, and the first pre-clean chamber is further configured to perform a degassing process.

18. The semiconductor processing apparatus of claim 12, wherein the first metal gate layer deposition chamber includes a physical vapor deposition chamber, a chemical vapor deposition chamber, or an atomic layer deposition chamber.

19. A method, comprising:
forming a first metal gate layer on a semiconductor wafer in a first process chamber of a first cluster of process chambers of a semiconductor processing apparatus;
removing moisture from the wafer by performing a degassing process on the semiconductor wafer in a second process chamber of the semiconductor processing apparatus;
at least partially removing an oxide layer from the first metal gate layer by performing a first precleaning process on the semiconductor wafer in the second process chamber of the semiconductor processing apparatus;
forming a second metal gate layer on the first metal gate layer, in a first process chamber of a second cluster of process chambers of the semiconductor processing apparatus; and
at least partially removing a second oxide layer on a surface of the second metal gate layer by performing a second precleaning process in a second process chamber of the second cluster of process chambers.

20. The method of claim 19, wherein the forming the second metal gate layer includes forming the first metal gate layer by at least one of physical vapor deposition, chemical vapor deposition, or atomic layer deposition.

* * * * *